(12) United States Patent
Morikawa et al.

(10) Patent No.: US 6,990,022 B2
(45) Date of Patent: Jan. 24, 2006

(54) SEMICONDUCTOR MEMORY DEVICE AND PORTABLE ELECTRONIC APPARATUS

(75) Inventors: Yoshinao Morikawa, Ikoma (JP); Masaru Nawaki, Nara (JP); Hiroshi Iwata, Ikoma-gun (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/850,212

(22) Filed: May 19, 2004

(65) Prior Publication Data
US 2004/0264252 A1 Dec. 30, 2004

(30) Foreign Application Priority Data
May 20, 2003 (JP) .............................. 2003-141751

(51) Int. Cl.
G11C 16/04 (2006.01)
(52) U.S. Cl. ........................... 365/185.28; 365/185.05; 365/185.29
(58) Field of Classification Search ........... 365/185.28, 365/185.29, 185.05, 185.01
See application file for complete search history.

(56) References Cited

U.S. PATENT DOCUMENTS 5,222,046 A 6/1993 Kreifels et al.
5,424,979 A 6/1995 Morii
5,509,134 A 4/1996 Fandrich et al.
6,018,816 A * 1/2000 Tateyama .................... 714/746
6,740,927 B1 * 5/2004 Jeng ............................ 257/315
2004/0186939 A1 * 9/2004 Miyanishi et al. .......... 710/100

OTHER PUBLICATIONS

Office Action mailed Jun. 1, 2005 for U.S. Appl. No. 10/851,709 filed May 20, 2004.

* cited by examiner

Primary Examiner—Gene N. Auduong
(74) Attorney, Agent, or Firm—Morrison & Foerster LLP

(57) ABSTRACT

A semiconductor memory device includes a memory cell array in which plural memory cells are arranged, a memory operation circuit, connected to the memory cell array, for executing a memory operation on the memory cell array, and a command controller, connected to the memory operation circuit, for receiving a command from the outside and generating a predetermined control signal to the memory operation circuit on the basis of the received command to control execution of the memory operation by the memory operation circuit. The memory cell includes a gate electrode formed over a semiconductor layer via a gate insulating film, a channel region disposed below the gate electrode, diffusion regions disposed on both sides of the channel region and having a conductive type opposite to that of the channel region, and memory functional units formed on both sides of the gate electrode and having the function of retaining charges.

13 Claims, 32 Drawing Sheets

SEMICONDUCTOR MEMORY DEVICE AND PORTABLE ELECTRONIC APPARATUS

BACKGROUND OF THE INVENTION

1. Field of the Invention

The present invention relates to a semiconductor memory device, a display and a portable electronic apparatus. More specifically, the present invention relates to a semiconductor memory device in which field-effect transistors each including a memory functional element having the function of retaining charges or polarization are arranged, and to a display and a portable electronic apparatus each having such a semiconductor memory device.

2. Description of the Related Art

Conventionally, a flash memory is typically used as a nonvolatile memory.

In a flash memory, as shown in FIG. 31, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby configuring a memory cell. A device isolation region 906 is formed around the memory cell (see, for example, JP-A 05-304277 (1993)).

The memory cell stores information in accordance with an amount of charges in the floating gate 902. In a memory cell array configured by arranging memory cells, by selecting a specific word line and a specific bit line and applying a predetermined voltage, an operation of rewriting/reading a desired memory cell can be performed.

In such a flash memory, when the amount of charges in the floating gate changes, a drain current (Id)-gate voltage (Vg) characteristic as shown in FIG. 32 is exhibited. When the amount of negative charges in the floating gate increases, the threshold increases and the Id-Vg curve shifts almost in parallel in the Vg increasing direction.

In such a flash memory, however, the insulting film 907 which separates the floating gate 902 from the word line 903 is necessary from the viewpoint of functions and, in order to prevent leakage of charges from the floating gate 902, it is difficult to reduce the thickness of the gate insulating film. Consequently, it is difficult to effectively reduce the thickness of the insulating film 907 and the gate insulating film, and it disturbs reduction in the size of the memory cell.

SUMMARY OF THE INVENTION

The present invention has been achieved in consideration of the problems, and its object is to provide a finer semiconductor memory device and a portable electronic apparatus.

In order to achieve the above object, a semiconductor memory device according to the present invention includes: a memory cell array in which memory cells are arranged in a matrix; memory operation circuit means, connected to the memory cell array, for executing a memory operation on the memory cell array; and command control means, connected to the memory operation circuit means, for receiving a command from an external user via a plurality of data terminals, and generating a predetermined control signal to the memory operation circuit means on the basis of the received command to control execution of the memory operation by the memory operation circuit means, wherein the memory operation circuit means is configured so as to be able to receive an address from the external user via a plurality of address input terminals and data to be stored into the memory cell array via the data terminal, and provide the data stored in the memory cell array to the external user via the data terminal, the command control means includes command/status register means, clock generation means and status decoder means, the command/status register means stores the command and traces a procedure of the memory operation, the clock generation means generates a timing signal to the memory operation circuit means and the command/status register means to latch the address and the data to the memory operation circuit means and to control latching of the command to the command/status register means, the status decoder means is connected to the command/status register means and decodes a command received by the command/status register means in order to generate a predetermined control signal for the memory operation circuit means, and the memory cell includes a gate electrode formed over a semiconductor layer via a gate insulating film, a channel region disposed below the gate electrode, diffusion regions disposed on both sides of the channel region and having a conductive type opposite to that of the channel region, and memory functional units formed on both sides of the gate electrode and having the function of retaining charges.

In the semiconductor memory device according to the present invention, the memory operation includes a reading operation, a programming operation, an erasing operation, a program-verifying operation and an erase-verifying operation, and the command includes at least a program command and an erase command.

In the semiconductor memory device according to the present invention, the command/status register means includes a command register and a status register, the command register stores a received command therein, and the status register stores the command therein and traces a procedure of the memory operation.

In the semiconductor memory device according to the present invention, the memory operation circuit means includes an address register for decoding an address in the memory cell array, and a data register for latching the data.

In the semiconductor memory device according to the present invention, the clock generation means includes: an address clock generator, connected to the address register, for generating an address timing signal to control latching of the address to the address register; a data clock generator, connected to the data register, for generating a data timing signal to control latching of the data to the data register; a command clock generator, connected to the command register, for generating a command timing signal to control latching of the command to the command register; and a status clock generator, connected to the status register, for generating a status timing signal to control latching of the command to the status register, and the data timing signal does not overlap with the command timing signal and the status timing signal.

In the semiconductor memory device according to the present invention, when the command control means is activated, the command control means receives a write enable signal which enables the command to be written into the command control means.

In the semiconductor memory device according to the present invention, the memory cell includes a gate electrode formed over a semiconductor layer via a gate insulating film, a channel region disposed below the gate electrode, diffusion regions disposed on both sides of the channel region and having a conductive type opposite to that of the channel region, and memory functional elements formed on both sides of the gate electrode and having the function of retaining charges. A memory function of the memory functional element and a transistor operation function of the gate insulating film are separated from each other. Consequently, it is easy to suppress the short channel effect by thinning the gate insulating film while maintaining the sufficient memory function. Further, a value of current flowing between the diffusion regions changes by rewriting more largely than that in the case of an EEPROM. Therefore, it facilitates discrimination between the programming state and the erasing state of the semiconductor memory device.

Further, the memory cell in the semiconductor memory device according to the present invention can be formed by a process which is very compatible with a normal transistor forming process on the basis of the configuration. Therefore, as compared with the case of using a conventional flash memory as a nonvolatile memory cell and configuring the semiconductor memory device having a peripheral circuit which is usually made by a transistor, the number of masks and the number of processes can be dramatically reduced. Consequently, the yield in manufacturing of the semiconductor memory device having both the memory cell and the peripheral circuit can be improved. Accordingly, the manufacturing cost is reduced and a very-reliable, cheap semiconductor memory device can be obtained.

The semiconductor memory device according to the present invention provides a command port structure of executing memory operations such as programming and erasing of data to/from the memory cell array via a data terminal. Since the memory operation circuit means is provided, circuit means for performing an operation of programming/erasing data to/from the memory cell array and an operation of verifying the programming/erasing (verifying completion of the operation) is provided. Since the command control means is provided, a command related to the memory operation can be received from a data bus connected to an external user such as an external processor. A command written in the command control means is a command for generating a control signal for programming/erasing data to/from a memory cell array and recognizing the data in the memory cell array after the programming/erasing operation.

The command port is configured by command control means, a data register connected to a data bus to receive program data, and an address register connected to an address bus for receiving address information during a predetermined memory operation period of programming or the like. Further, the command control means is configured by including: the command/status register means, connected to a data bus, for receiving a command from the external user; the clock generation means for generating a necessary timing signal; and the status decoder means for decoding a command received by the command/status register means.

The command control means provides a program and erase algorithm for programming/erasing data to/from the memory cell array. An erase- algorithm provides a voltage necessary for erasing data in the memory cell array and confirming that data in the memory cell array is erased. An erase cycle is monitored and, for example, an erase pulse having a predetermined pulse width is repetitively applied until the erasing is completed. The pulse width may be fixed or changed every cycle. In the case where the number of pulse application times reached the maximum number and complete erasing has not been finished, an error is detected.

Similarly, a program algorithm provides an operation of programming each of locations in the memory cell array during programming of the memory cell array and, after that, verifying the programmed data. The program cycle is monitored and, for example, until programming is completed, a program pulse having a predetermined pulse width is repetitively applied. The pulse width may be fixed or changed every cycle. When the number of times of application of pulses reaches the maximum number and programming is not completed, an error is detected. It is sufficient to employ an optimum programming/erasing algorithm in accordance with the characteristics of a memory cell.

The present invention also provides a display and a portable electronic apparatus each having the semiconductor memory device.

With such a configuration, in the case of using the semiconductor memory device of the present invention for storing information for correcting variations in display after a display panel is manufactured, uniform picture quality can be obtained in products of the displays. Moreover, the process of simultaneously forming the memory cell and the logic circuit is simple, so that the manufacturing cost can be suppressed and the operation speed can be improved by high-speed reading operation. Thus, the cheap and high-performance display and the portable electronic apparatus can be obtained.

DETAILED DESCRIPTION OF THE INVENTION

Figure 1:
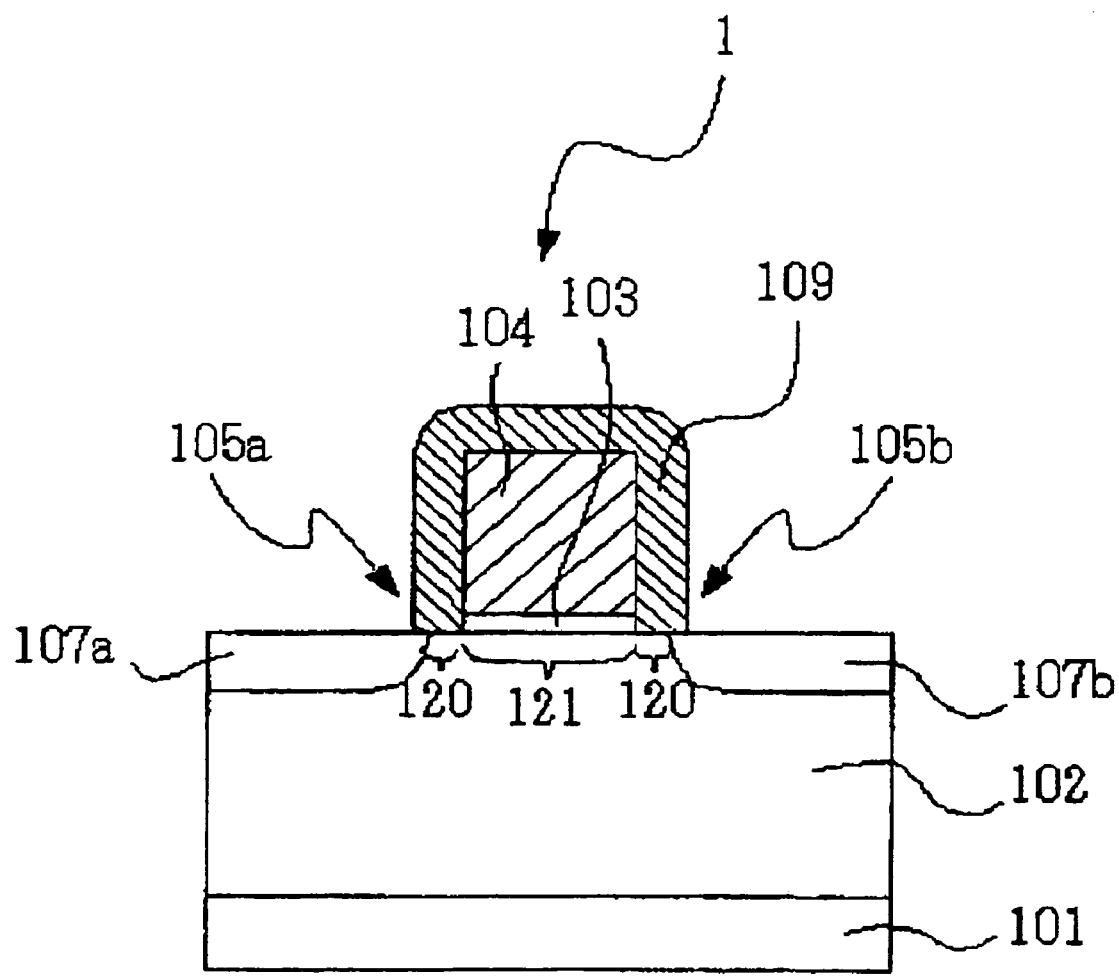
FIG. 1 is a schematic sectional view showing a main part of a memory cell (first embodiment) in a semiconductor memory device of the present invention.

A semiconductor memory device according to the present invention is mainly configured by a memory cell array in which memory cells are arranged in a matrix, memory operation circuit means, connected to the memory cell array, for executing a memory operation on the memory cell array, and command control means, connected to the memory operation circuit means, for receiving commands from an external user via a plurality of data terminals, and generating a predetermined control signal to the memory operation circuit means on the basis of the received command in order to control execution of a memory operation by the memory operation circuit means.

A memory cell is mainly configured by a semiconductor layer, a gate insulating film, a gate electrode, a channel region, a diffusion region and a memory functional element. Herein, the channel region is usually a region having the same conductive type as that of the semiconductor layer and denotes a region immediately below the gate electrode. The diffusion region denotes a region having a conductive type opposite to that of the channel region.

Specifically, although the memory cell of the present invention may be configured by a region of a first conductive type as a diffusion region, a region of a second conductive type as a channel region, a memory functional element disposed across the boundary of the regions of the first and second conductive types, and an electrode provided via a gate insulating film, it is proper that the nonvolatile memory cell of the present invention is configured by a gate electrode formed on a gate insulating film, two memory functional elements formed on both sides of the gate electrode, two diffusion regions disposed on the sides of the gate electrode opposite to the memory functional elements, and a channel region disposed below the gate electrode.

Preferably, the semiconductor device of the present invention is formed as the semiconductor layer on the semiconductor substrate, more preferably, on a well region of the first conductive type formed in the semiconductor substrate.

The semiconductor substrate is not particularly limited as long as it can be used for a semiconductor device. For example, a bulk substrate made of an element semiconductor such as silicon or germanium or a compound semiconductor such as silicon germanium, GaAs, InGaAs, ZnSe, or GaN can be mentioned. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a silicon layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer or a body region may be provided below a channel region.

The gate insulating film is not particularly limited as long as it can be usually used for a semiconductor device. For example, a single-layer film or a multilayer film of an insulating film such as a silicon oxide film or a silicon nitride film, and a high-dielectric-constant film such as an aluminum oxide film, a titanium oxide film, a tantalum oxide film, or a hafnium oxide film can be used. Particularly, a silicon oxide film is preferred. A proper thickness of the gate insulating film is, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end on the gate insulating film. Although it is preferable that the gate electrode be formed in an integral form without being separated by a single-layer or multilayer conductive film, the gate electrode may be also disposed in a state where it is separated by a single-layered or multilayer conductive film. The gate electrode may have a sidewall insulating film on its sidewalls. The gate electrode is not particularly limited as long as it is used for a semiconductor device. The gate electrode is formed by a single-layer or multilayer film made by a conductive film, for example, polysilicon, a metal such as copper or aluminum, a high-refractory metal such as tungsten, titanium or tantalum, and a silicide or the like with the high refractory metal. A proper film thickness of the gate electrode is, for example, about 50 to 400 nm. Under the gate electrode, a channel region is formed.

Preferably, the gate electrode is formed only on the sidewalls of the memory functional element or does not cover the top portion of the memory functional element. By such arrangement, a contact plug can be disposed closer to the gate electrode, so that reduction in the size of the memory cell is facilitated. It is easy to manufacture the memory cell having such simple arrangement, so that the yield in manufacturing can be improved.

The memory functional element has at least the function of retaining charges (hereinafter, described as "charge retaining function"). In other words, the memory functional element has the function of accumulating and retaining charges, the function of trapping charges, or the function of holding a charge polarization state. The function is exhibited, for example, when the memory functional element includes a film or region having the charge retaining function. Elements having the function are: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional element can be formed by, for example, a single-layer or multilayer structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reasons that the silicon nitride film can obtain a large hysteretic characteristic since a number of levels of trapping charges exist. In addition, the charge retention time is long and a problem of charge leakage due to occurrence of a leak path does not occur, so that the retaining characteristics are good. Further, silicon nitride is a material which is normally used in an LSI process.

By using the insulating film including a film having the charge retaining function such as a silicon nitride film as the memory functional element, reliability of retention of information can be increased. Since the silicon nitride film is an insulator, even in the case where a charge leak occurs in part of the silicon nitride film, the charges in the whole silicon nitride film are not lost immediately. In the case of arranging a plurality of sidewall memory cells, even if the distance between the memory cells is shortened and neighboring memory functional elements come into contact with each other, unlike the case where the memory functional elements are made of conductors, information stored in the memory functional elements is not lost. Further, a contact plug can be disposed closer to the memory functional element. In some cases, the contact plug can be disposed so as to overlap with the memory functional element. Thus, reduction in the size of the memory cell is facilitated.

In order to increase the reliability of retention of information, the film having the charge retaining function does not always have to have a film shape. Preferably, films having the charge retaining function exist discretely in an insulating film. Specifically, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a lamination structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional element for the reason that an injection amount of charges into the conductor or semiconductor can be freely controlled and multiple values can be easily obtained.

Further, it is preferable to use the insulating film including at least one conductor or semiconductor dot as the memory functional element for the reason that it becomes easier to perform programming and erasing by direct tunneling of charges, and reduction in power consumption can be achieved.

Alternatively, as a memory functional element, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that programming/erasing can be performed at high speed.

As the insulating film configuring the memory functional element, a film having a region of suppressing escape of charges or the function of suppressing escape of charges is appropriate. One of films having the function of suppressing escape of charges is a silicon oxide film.

The charge retaining film included in the memory functional element is disposed on both sides of the gate electrode directly or via an insulating film, and is disposed on the semiconductor layer (semiconductor substrate, well region, body region or source/drain region or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be properly adjusted in accordance with the performance or the like of a semiconductor memory device to be obtained. In the case of using an SOI substrate as a semiconductor substrate, the diffusion region may have a junction depth smaller than the thickness of the surface semiconductor layer. Preferably, the diffusion region has junction depth almost the same as the thickness of the surface semiconductor layer.

The diffusion region may be disposed so as to overlap an end of the gate electrode, so as to match an end of the gate electrode, or so as to be offset from the gate electrode end. The case where the diffusion region is offset is particularly preferable because easiness of inversion of the offset region below the charge retaining film largely changes in accordance with an amount of charges accumulated in the memory functional element when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance from one of the gate electrode terminals to the closer diffusion area in the gate length direction be shorter than the thickness of the charge retaining film extending in the direction parallel with the gate length direction. It is particularly important that at least a part of the film or region having the charge retaining function in the memory functional element overlaps with a part of the diffusion region. This is because the essence of the memory cell as a component of the semiconductor memory device of the present invention is to rewrite stored information by an electric field which is applied across the memory functional element in accordance with the voltage difference between the gate electrode which exists only in the sidewall portion of the memory functional element and the diffusion region.

A part of the diffusion region may extend at a level higher than the surface of the channel region, that is, the lower face of the gate insulating film. In this case, it is proper that, on the diffusion region formed in the semiconductor substrate, the conductive film is laminated so as to be integrated with the diffusion region. The conductive film is made of a semiconductor such as polysilicon or amorphous silicon, silicide, the above-mentioned metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional element in cooperation with the gate electrode.

The memory cell of the present invention can be formed by a normal semiconductor process in accordance with, for example, a method similar to the method of forming the sidewall spacer having the single-layer or multilayer structure on the sidewalls of the gate electrode. Specific examples are: a method of forming the gate electrode, after that, forming a single-layer film or multilayer film including the charge retaining film such as a film having the function of retaining charges (hereinafter, described as "charge retaining film"), charge retaining film/insulating film, insulating film/ charge retaining film, or insulating film/charge retaining film/insulating film, and etching back the formed film under proper conditions so as to leave the films in a sidewall spacer shape; a method of forming an insulating film or charge retaining film, etching back the film under proper conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode, and etching back the material under proper conditions so as to leave the insulating film material in a sidewall spacer shape; and a method of forming a gate electrode, after that, forming the single-layer film or multilayer film, and patterning the film with a mask. According to another method, before the gate electrode is formed, the charge retaining film, charge retaining film/insulating film, insulating film/charge retaining film, insulating film/ charge retaining film/insulating film, or the like is formed. An opening is formed in a region which becomes the channel region of the films, a gate electrode material film is formed on the entire surface, and the gate electrode material film is patterned in a shape including the opening and larger than the opening.

In the case of configuring the memory cell array by arranging memory cells of the present invention, the best mode of the memory cell satisfies all of the following requirements: (1) the gate electrodes of a plurality of memory cells are integrated and have the function of a word line, (2) the memory functional elements are formed on both sides of the word line, (3) an insulator, particularly, a silicon nitride film retains charges in the memory functional element, (4) the memory functional element is configured by an ONO (Oxide Nitride Oxide) film and the silicon nitride film has a surface almost parallel with the surface of the gate insulating film, (5) a silicon nitride film in the memory functional element is isolated from a word line and a channel region by a silicon oxide film, (6) the silicon nitride film in the memory functional element and a diffusion region overlap with each other, (7) the thickness of the insulating film separating the silicon nitride film having the surface which is almost parallel with the surface of the gate insulating film from the channel region or semiconductor layer and the thickness of the gate insulating film are different from each other, (8) an operation of programming/erasing one memory cell is performed by a single word line, (9) there is no electrode (word line) having the function of assisting the programming/erasing operation on the memory functional element, and (10) in a portion in contact with the diffusion region immediately below the memory functional element, a region of high concentration of impurity whose conductive type is opposite to that of the diffusion region is provided. It may be sufficient for the memory cell to satisfy at least one of the requirements.

A particularly preferable combination of the requirements is that, for example, (3) an insulator, particularly, a silicon nitride film holds charges in the memory functional element, (6) the insulating film (silicon nitride film) in the memory functional element and the diffusion region overlap with each other, and (9) there is no electrode (word line) having the function of assisting the programming/erasing operation on the memory functional element.

In the case where the memory cell satisfies the requirements (3) and (9), it is very useful for the following reasons. First, the bit line contact can be disposed closer to the memory functional element on the word line sidewall or even when the distance between memory cells is shortened, a plurality of memory functional elements do not interfere with each other, and stored information can be held. Therefore, reduction in the size of the memory cell is facilitated. In the case where the charge retaining region in the memory functional element is made of a conductor, as the distance between memory cells decreases, interference occurs between the charge retaining regions due to capacitive coupling, so that stored information cannot be held.

In the case where the charge retaining region in the memory functional element is made of an insulator (for example, a silicon nitride film), it becomes unnecessary to make the memory functional element independent for each memory cell. For example, the memory functional elements formed on both sides of a single word line shared by a plurality of sidewall memory cells do not have to be isolated for each memory cell. The memory functional elements formed on both sides of one word line can be shared by a plurality of memory cells sharing the word line. Consequently, a photo etching process for isolating the memory functional element becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional element is made of a conductor (for example, polysilicon film), even when the memory functional element is formed at the same microfabrication level, a memory cell occupied area can be reduced. In the case where the charge retaining region in the memory functional element is made of a conductor, the photo etching process for isolating the memory functional element for each memory cell is necessary, and a margin for positioning in the photolithography process and a margin for film reduction by etching are necessary.

Moreover, since the electrode having the function of assisting the programming and erasing operations does not exist on the memory functional element and the device structure is simple, the number of processes decreases, so that the yield in manufacturing can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) are satisfied. Specifically, by overlapping the charge retaining region in the memory functional element with the diffusion region, programming and erasing can be performed with a very low voltage. Specifically, with a low voltage of 5 V or less, the programming and erasing operations can be performed. The action produces a very large effect also from the viewpoint of circuit designing. Since it becomes unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional element, even if the requirement (6) is not satisfied, specifically, even if the conductor in the memory functional element and the diffusion region do not overlap with each other, programming operation can be performed. This is because that the conductor in the memory functional element assists programming operation by capacitive coupling with the gate electrode.

In the case where the requirement (9) is not satisfied, specifically, in the case where the electrode having the function of assisting the programming and erasing operations exists on the memory functional element, even if the requirement (6) is not satisfied, specifically, even if the insulator in the memory functional element and the diffusion region do not overlap with each other, programming operation can be performed.

In the semiconductor memory device of the present invention, a transistor may be connected in series with one of or both sides of a memory cell, or the memory cell may be mounted on the same chip with a logic transistor. In such a case, the semiconductor device of the present invention, particularly, the memory cell can be formed by a process having high compatibility with a process of forming a normal standard transistor such as a transistor or a logic transistor, so that they can be formed simultaneously. Therefore, a process of forming both the memory cell and a transistor or a logic transistor is very simple and, as a result, a cheap embedding device can be obtained.

In the semiconductor memory device of the present invention, the memory cell can store information of two or more values in one memory functional element. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional element.

The semiconductor memory device of the present invention can be widely applied by being combined with a logic device, a logic circuit or the like to: a data processing system such as a personal computer, a note-sized computer, a laptop computer, a personal assistant/transmitter, a mini computer, a workstation, a main frame computer, a multiprocessor/computer, or a computer system of any other type; an electronic component configuring the data processing system, such as a CPU, a memory or a data memory device; a communication apparatus such as a telephone, a PHS, a modem or a router; an image display apparatus such as a display panel or a projector; a business apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage machine, a bathroom scale or a manometer; and an electronic apparatus such as a portable memory device such as an IC card or a memory card. Particularly, it is effective to apply the semiconductor memory device to portable electronic apparatuses such as portable telephone, portable information terminal, IC card, memory card, portable computer, portable game device, digital camera, portable motion picture player, portable music player, electronic dictionary and watch. The semiconductor memory device of the present invention may be provided as at least a part of a control circuit or a data storing circuit of an electronic apparatus or, if necessary, detachably assembled.

Embodiments of the semiconductor memory device, the display and the portable electronic apparatus according to the present invention will be described below with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional elements 105a and 105b for actually retaining charges. The memory functional element refers to a part in which charges are actually accumulated by rewriting operation in the memory functional element or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film configure a part of the channel region.

Figure 2A:
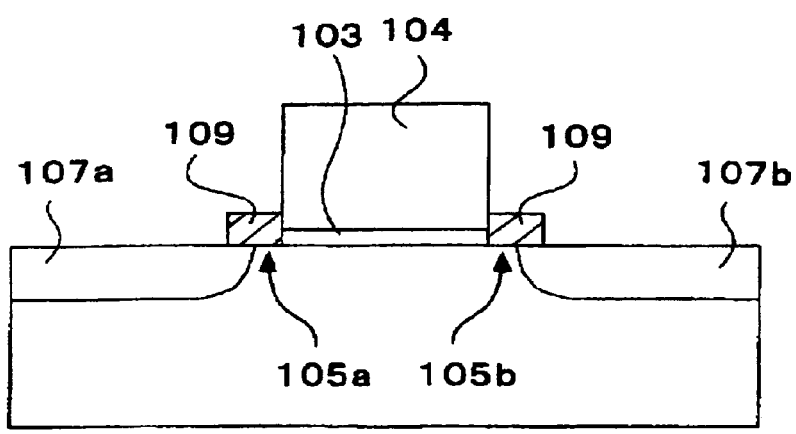
FIGS. 2A and 2B are schematic sectional views each showing a main part of a modification of the memory cell (first embodiment) in the semiconductor memory device of the present invention.
Figure 2B:
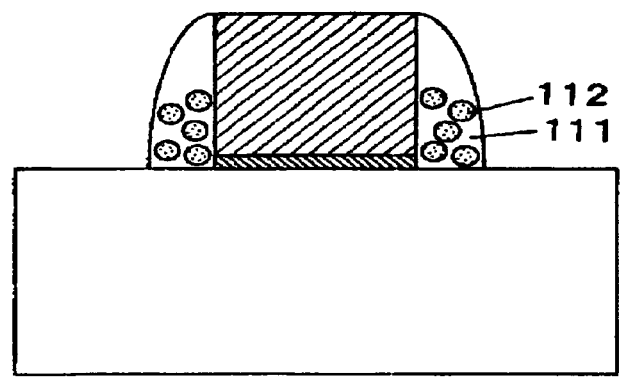

The memory functional elements 105a and 105b for substantially retaining charges are side wall parts of the gate electrode 104. Therefore, it is sufficient that the silicon nitride film 109 is formed only in regions corresponding to the parts (see FIG. 2A). The memory functional elements 105a and 105b may have a structure in which particles 111 made of conductor or semiconductor having a nanometer size are distributed in an insulating film 112 (see FIG. 2B). When the size of the particle 111 is less than 1 nm, the quantum effect is too large and it becomes difficult for charges to tunnel dots. When the size exceeds 10 nm, however, a noticeable quantum effect does not appear at room temperature. Therefore, the diameter of the particle 111 lies preferably in the range from 1 nm to 10 nm. Further, the silicon nitride film 109 serving as a charge retaining film may be formed in the side wall spacer shape on side faces of the gate electrode (see FIG. 3).

The principle of the programming operation of the memory cell will be described with reference to FIGS. 3 and 4. The case where whole memory functional elements 131a and 131b have the function of retaining charges will be described. "Programming" denotes here injection of electrons into the memory functional elements 131a and 131b when the memory cell is of the N channel type. Hereinafter, on assumption that the memory cell is of the N channel type, description will be given.

Figure 3:
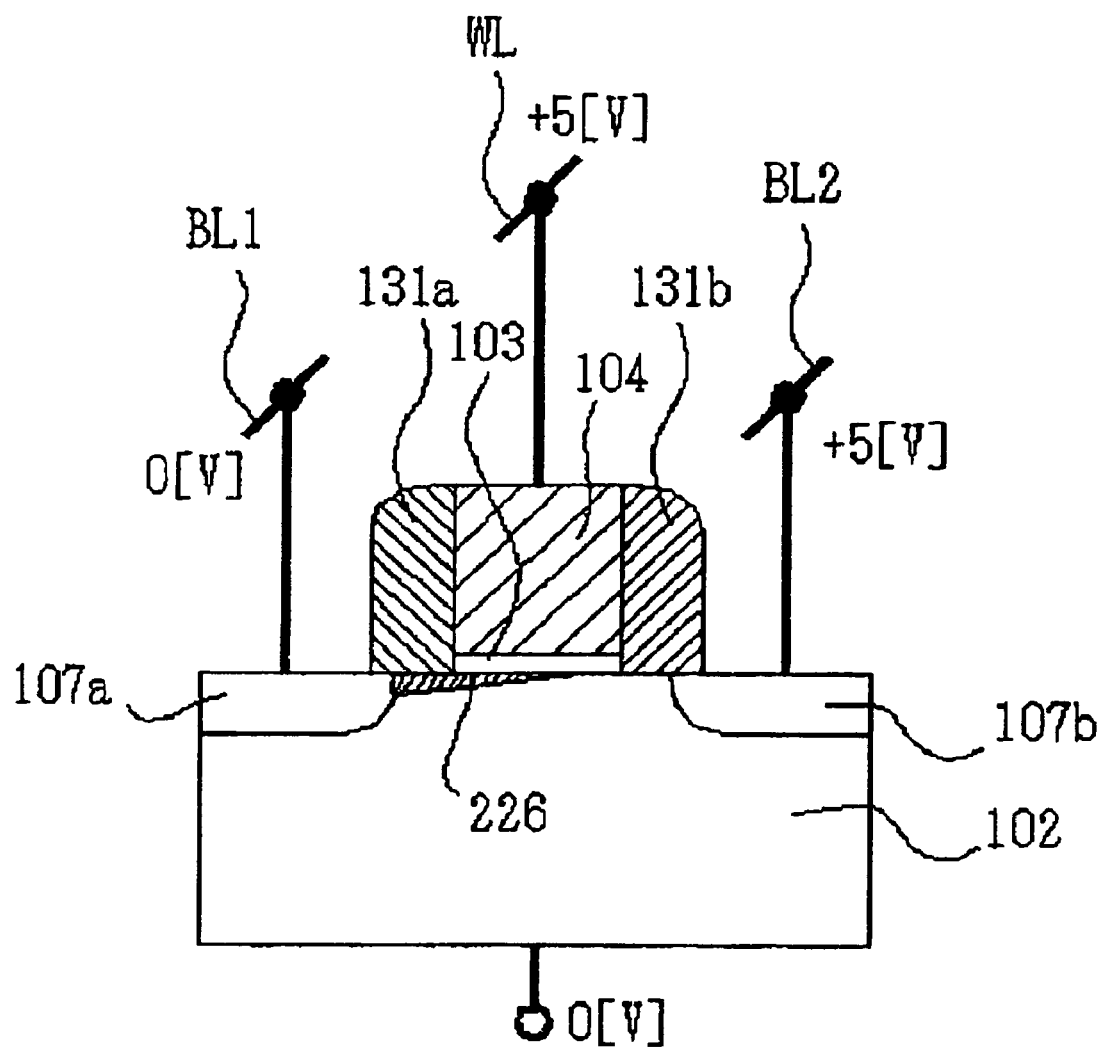
FIG. 3 is a diagram showing a programming operation of the memory cell (first embodiment) in the semiconductor memory device of the present invention.

In order to inject electrons (to program) into the second memory functional element 131b, as shown in FIG. 3, the first diffusion region 107a of the N-type is set as the source electrode, and the second diffusion region 107b of the N-type is set as the drain electrode. For example, 0 V is applied to the first diffusion region 107a and the P-type well region 102, +5 V is applied to the second diffusion region 107b, and +5 V is applied to the gate electrode 104. With such voltage parameters, an inversion layer 226 extends from the first diffusion region 107a (source electrode), but does not reach the second diffusion region 107b (drain electrode), so that a pinch-off point is generated. Electrons are accelerated from the pinch-off point to the second diffusion region 107b (drain electrode) by high electric field and become so-called hot electrons (conductive electrons of high energy). The hot electrons are injected into the second memory functional element 131b, thereby performing programming. Since hot electrons are not generated in the vicinity of the first memory functional element 131a, programming is not performed.

Figure 4:
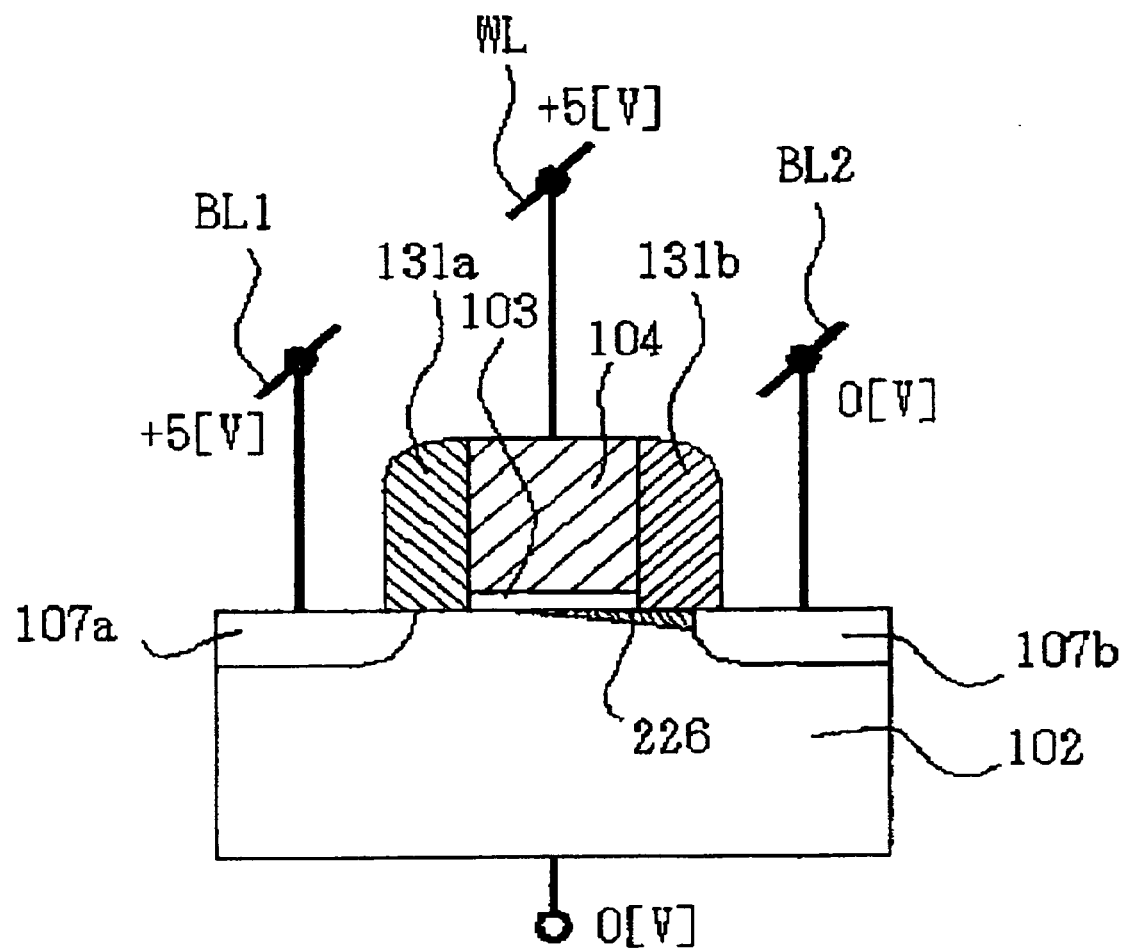
FIG. 4 is a diagram showing the programming operation of the memory cell (first embodiment) in the semiconductor memory device of the present invention.

On the other hand, in order to inject electrons (to program) into the first memory part 131a, as shown in FIG. 4, the second diffusion region 107b is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. As described above, by interchanging the source and drain regions in the case of injecting electrons into the second memory functional element 131b, programming can be performed by injecting electrons into the first memory functional element 131a.

The principle of erasing operation of the memory cell will now be described with reference to FIGS. 5 and 6.

Figure 5:
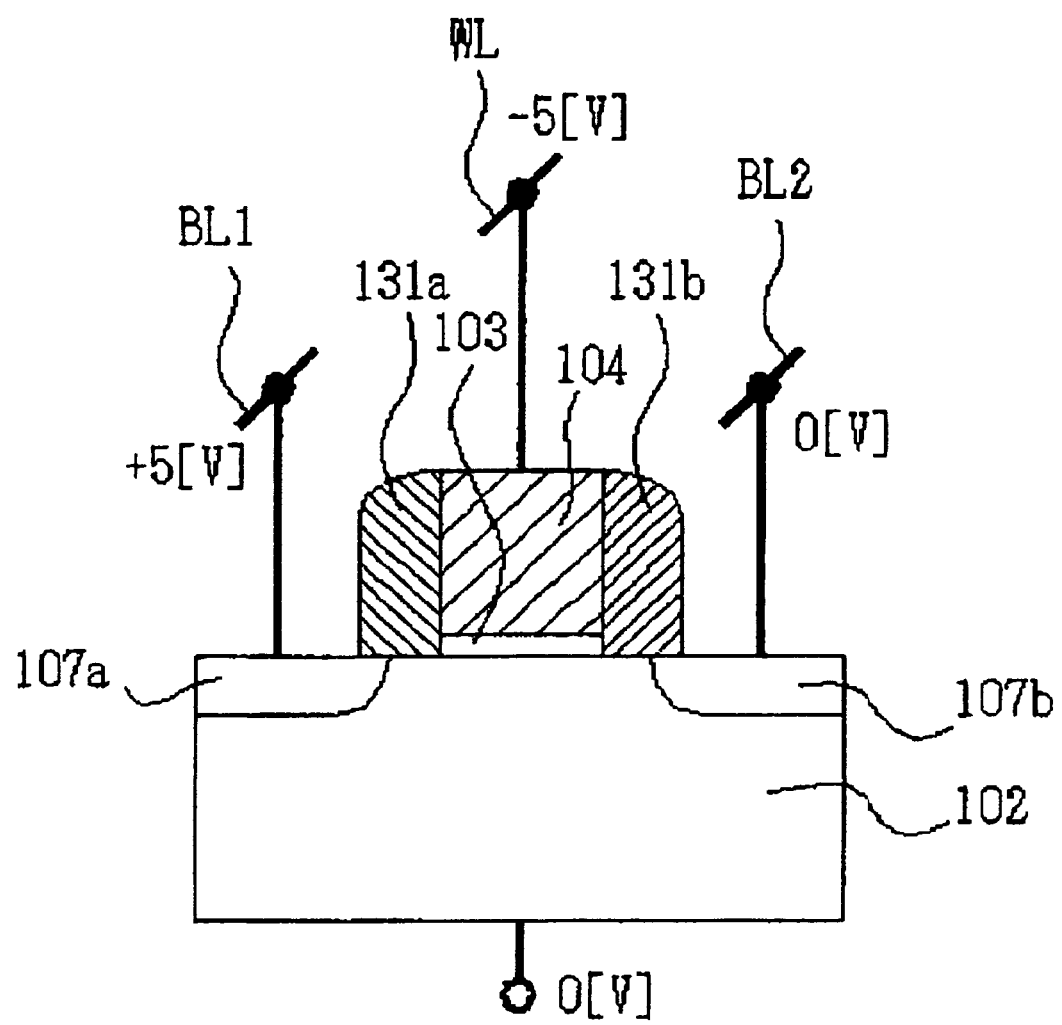
FIG. 5 is a diagram showing an erasing operation of the memory cell (first embodiment) in the semiconductor memory device of the present invention.

In a first method of erasing information stored in the first memory functional element 131a, as shown in FIG. 5, a positive voltage (for example, +5 V) is applied to the first diffusion region 107a, 0 V is applied to the P-type well region 102, a backward bias is applied to the PN junction between the first diffusion region 107a and the P-type well region 102, and a negative voltage (for example, −5 V) is applied to the gate electrode 104. At this time, in the vicinity of the gate electrode 104 in the PN junction, due to the influence of the gate electrode to which the negative electrode is applied, the gradient of potential becomes particularly sharp. Due to this, hot holes (positive holes of high energy) are generated on the side of the P-type well region 102 in the PN junction by interband tunneling. The hot holes are attracted by the gate electrode 104 having the negative potential and, as a result, holes are injected into the first memory functional element 131a. In such a manner, information in the first memory functional element 131a is erased. At this time, it is sufficient to apply 0 V to the second diffusion region 107b.

In the case of erasing information stored in the second memory functional element 131b, it is sufficient to interchange the potential in the first diffusion region and the potential in the second diffusion region in the above example.

Figure 6:
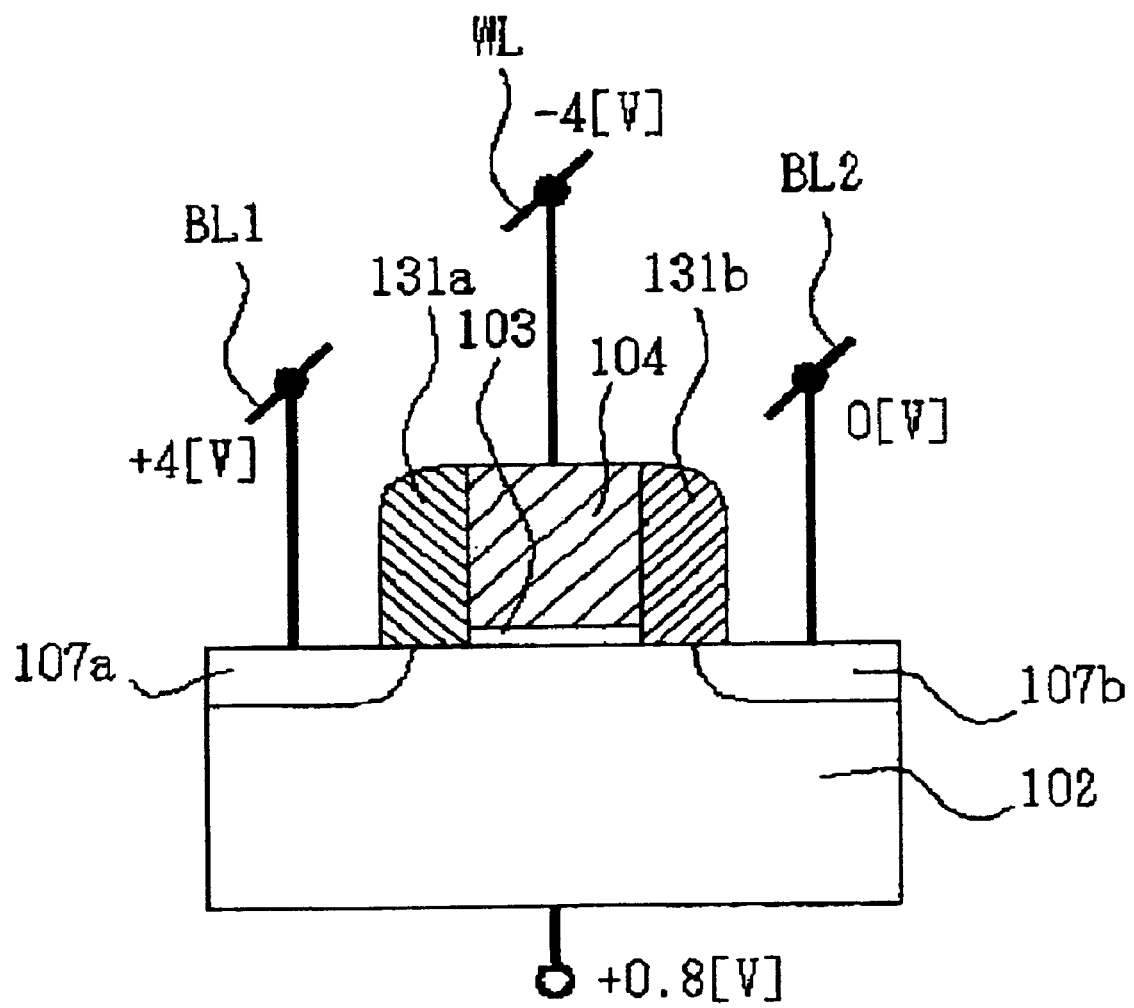
FIG. 6 is a diagram showing the erasing operation of the memory cell (first embodiment) in the semiconductor memory device of the present invention.

According to a second method of erasing information stored in the first memory functional element 131a, as shown in FIG. 6, a positive voltage (for example, +4 V) is applied to the first diffusion region 107a, 0 V is applied to the second diffusion region 107b, a negative voltage (for example, −4 V) is applied to the gate electrode 104, and a positive voltage (for example, +0.8 V) is applied to the P-type well region 102. At this time, a forward voltage is applied between the P-type well region 102 and the second diffusion region 107b, and electrons are injected into the P-type well region 102. The injected electrons are diffused to the PN junction between the P-type well region 102 and the first diffusion region 107a and accelerated by the high electric field, thereby becoming hot electrons. The hot electrons generate electron-hole pairs in the PN junction. To be specific, by applying a forward voltage between the P-type well region 102 and the second diffusion region 107b, electrons injected in the P-type well region 102 become a trigger and hot holes are generated in the PN junction positioned on the opposite side. The hot holes generated in the PN junction are attracted by the gate electrode 104 and, as a result, positive holes are injected into the first memory functional element 131a.

According to the method, also in the case where only a voltage insufficient to generate hot holes by interband tunneling is applied in the PN junction between the P-type well region and the first diffusion region 107a, electrons injected in the second diffusion region 107b become a trigger of generating the electron-hole pairs in the PN junction, and hot holes can be generated. Therefore, a voltage in the erasing operation can be decreased. Particularly, when the offset region 120 (see FIG. 1) exists, an effect that the gradient of potential in the PN junction becomes sharp by the gate electrode to which a negative potential is applied is small. Consequently, it is difficult to generate hot holes by the interband tunneling. The second method overcomes the drawback and can realize the erasing operation with a low voltage.

In the case of erasing information stored in the first memory functional element 131a, according to the first erasing method, +5 V has to be applied to the first diffusion region 107a. According to the second erasing method, +4 V is sufficient. As described above, according to the second method, the voltage in the erasing operation can be decreased, so that power consumption can be reduced and deterioration in the memory cell due to hot carriers can be suppressed.

In any of the erasing methods, over-erasure does not occur easily in the memory cell. The over-erasure here denotes a phenomenon that as the amount of positive holes accumulated in the memory functional element increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional element, only electrons are induced below the memory functional element, but an influence is hardly exerted to the potential in the channel region below the gate insulating film. Since the threshold at the time of erasing is determined by the potential below the gate insulating film, occurrence of over-erasure is suppressed.

Figure 7:
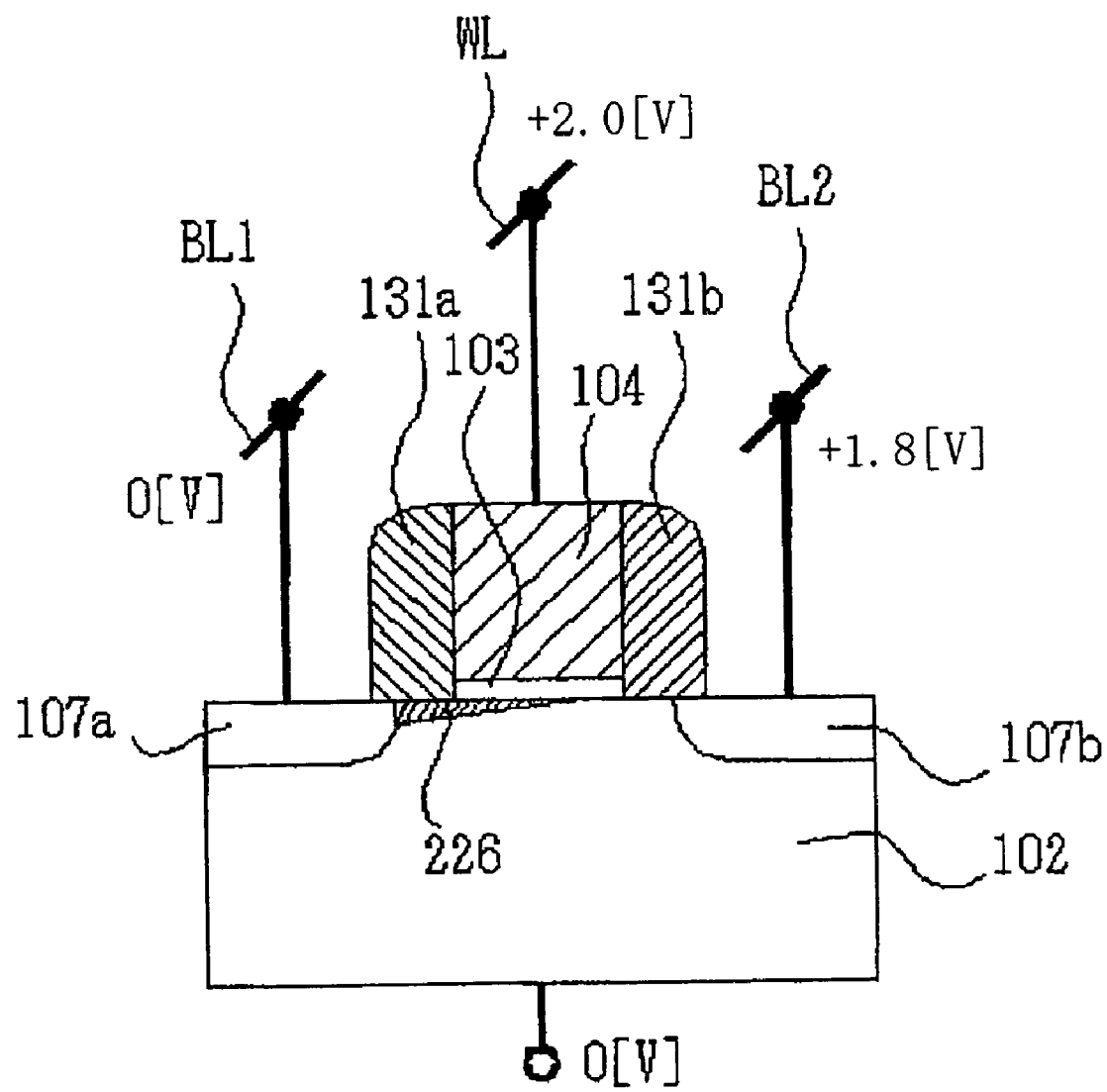
FIG. 7 is a diagram showing a reading operation of the memory cell (first embodiment) in the semiconductor memory device of the present invention.

Further, the principle of reading operation of the memory cell will be described with reference to FIG. 7.

In the case of reading information stored in the first memory functional element 131a, a transistor is operated in a saturation region by using the first diffusion region 107a as a source electrode and using the second diffusion region 107b as a drain electrode. For example, 0 V is applied to the first diffusion region 107a and the P-type well region 102, +1.8 V is applied to the second diffusion region 107b, and +2 V is applied to the gate electrode 104. In the case where no electrons are accumulated in the first memory functional element 131a at this time, drain current tends to flow. On the other hand, in the case where electrons are accumulated in the first memory functional element 131a, an inversion layer is not easily formed in the vicinity of the first memory functional element 131a, so that the drain current does not easily flow. Therefore, by detecting the drain current, information stored in the first memory functional element 131a can be read. Since the pinch off occurs in the vicinity of the drain at this time, whether charges are accumulated in the second memory functional element 131b or not does not exert an influence on the drain current.

In the case of reading information stored in the second memory functional element 131b, the transistor is operated in a saturation region by using the second diffusion region 107b as a source electrode and using the first diffusion region 107a as a drain electrode. It is sufficient to apply, for example, 0 V to the second diffusion region 107b and the P-type well region 102, +1.8 V to the first diffusion region 107a, and +2 V to the gate electrode 104. By interchanging the source and drain regions of the case of reading information stored in the first memory functional element 131a, information stored in the second memory functional element 131b can be read.

In the case where there is a channel region (offset region 120) which is not covered with the gate electrode 104, an inversion layer is dissipated or formed according to the presence/absence of excessive charges in the memory functional elements 131a and 131b in the channel region which is not covered with the gate electrode 104. As a result, a large hysteresis (change in the threshold) can be obtained. However, if the offset region 120 is too wide, the drain current largely decreases and the reading speed becomes much lower. Therefore, it is preferable to determine the width of the offset region 120 so that a sufficient hysteresis and reading speed can be obtained.

Even in the case where the diffusion regions 107a and 107b extend to the ends of the gate electrode 104, that is, the diffusion regions 107a and 107b overlap with the gate electrode 104, the threshold of the transistor is hardly changed by the programming operation. However, parasitic resistance at ends of the source and drain largely changes and the drain current greatly decreases (by one digit or more). Therefore, the reading operation can be performed by detecting the drain current, and the function of a memory can be obtained. In the case where a larger memory hysteresis effect is necessary, preferably, the diffusion regions 107a and 107b do not overlap with the gate electrode 104 (the offset region 120 exists).

By the above operating method, selective programming/erasing of two bits per one transistor can be realized. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be configured.

In the above-described operating method, by interchanging the source electrode and the drain electrode, programming and erasing of two bits per one transistor is performed. Alternatively, the memory cell can also operate as a 1-bit memory by fixing the source electrode and the drain electrode. In this case, a common fixed voltage can be applied to one of the source and drain regions and the number of bit lines connected to the source and drain regions can be reduced to the half.

As obvious from the above description, in the memory cell in the semiconductor memory device of the present invention, the memory functional element is formed independently of the gate insulating film, and is formed on both sides of the gate electrode, so that 2-bit operation is possible. Since each memory functional element is isolated by the gate electrode, interference at the time of rewriting is effectively suppressed. Further, since the gate insulating film is isolated from the memory functional element, the memory cell can be formed thinly and a short channel effect can be suppressed. Therefore, reduction in size of the memory cell and, accordingly, the semiconductor memory device can be achieved easily.

Second Embodiment

Figure 8:
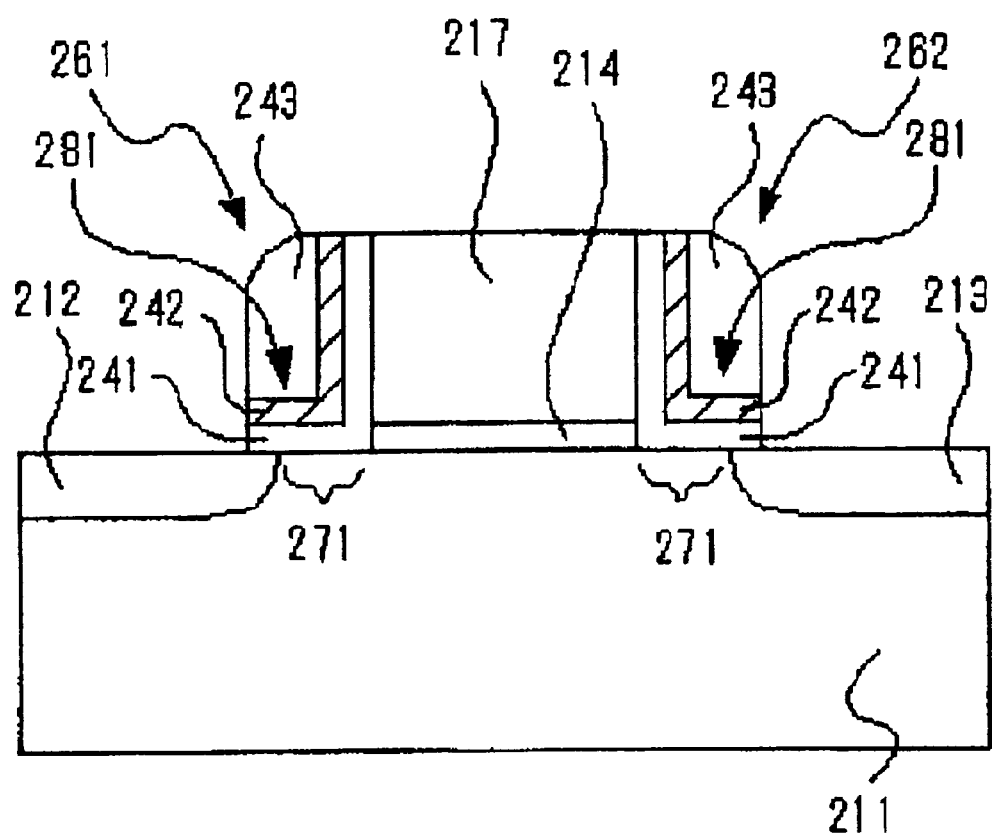
FIG. 8 is a schematic sectional view showing a main part of a memory cell (second embodiment) in the semiconductor memory device of the present invention.

A memory cell in a semiconductor memory device according to a second embodiment has a configuration substantially similar to that of the memory cell 1 of FIG. 1 except that, as shown in FIG. 8, each of memory functional elements 261 and 262 is configured by a charge retaining region (which is a charge accumulating region and may be a film having the function of retaining charges) and a region for suppressing escape of charges (or a film having the function of suppressing escape of charges).

Preferably, from the viewpoint of improving the retaining characteristic of the memory, the memory functional element includes a charge retaining film having the function of retaining charges and an insulating film. In the embodiment, a silicon nitride film 242 having a level of trapping charges is used as the charge retaining film and silicon oxide films 241 and 243 having the function of preventing escape of charges accumulated in the charge retaining film are used as the insulating films. When the memory functional element includes the charge retaining film and the insulating film, escape of charges is prevented and the retaining characteristic can be improved. As compared with the case where the memory functional element is configured only by the charge retaining film, the volume of the charge retaining film can be reduced properly and, by regulating movement of charges in the charge retaining film, occurrence of a change in the characteristics due to movement of charges during retention of information can be suppressed. Further, by employing the structure in which the silicon nitride film 242 is sandwiched by the silicon oxide films 241 and 243, the charge injection efficiency at the time of rewriting operation becomes high and the operation can be performed at higher speed. In the memory cell, the silicon nitride film 242 may be replaced with a ferroelectric.

The regions of retaining charges (silicon nitride film 242) in the memory functional elements 261 and 262 overlap with diffusion regions 212 and 213. Overlap means here that at least a part of the charge retaining region (silicon nitride film 242) exists over at least a part of the diffusion regions 212 and 213. 211 denotes a semiconductor substrate, 214 denotes a gate insulating film, 217 indicates a gate electrode, and 271 expresses offset regions between the gate electrode 217 and the diffusion regions 212 and 213. Although not shown, the uppermost surface of the semiconductor substrate 211 below the gate insulating film 214 is a channel region.

A method of forming a memory cell of the present invention will now be described by using the memory cell shown in FIG. 8 as an example. First, the gate insulating film 214 and the gate electrode 217 are formed over the semiconductor substrate 211 by a known procedure. Subsequently, on the entire surface of the semiconductor substrate 211, the silicon oxide film 241 having a thickness of 0.8 to 20 nm, more preferably 3 to 10 nm is formed by thermal oxidation or deposited by CVD (Chemical Vapor Deposition). Next, on the entire surface of the silicon oxide film 241, the silicon nitride film 242 having a thickness of 2 to 15 nm, more preferably 3 to 10 nm is deposited by CVD. Further, on the entire surface of the silicon nitride film, the silicon oxide film 243 having a thickness of 20 to 70 nm is deposited by CVD.

Subsequently, by etching back the silicon oxide film/silicon nitride film/silicon oxide film by anisotropic etching, a memory functional element which is optimum to store information is formed in a sidewall spacer shape on side walls of the gate electrode.

After that, ions are implanted by using the gate electrode 217 and the memory functional element having the sidewall spacer shape as a mask, thereby forming the diffusion layer regions (source and drain regions) 212 and 213. After that, a silicide process and an upper wiring process may be performed by a known procedure.

Effects produced by the overlap between the silicon nitride films 242 as the charge retaining regions in the memory functional elements 261 and 262 and the diffusion regions 212 and 213 will now be described.

Figure 9:
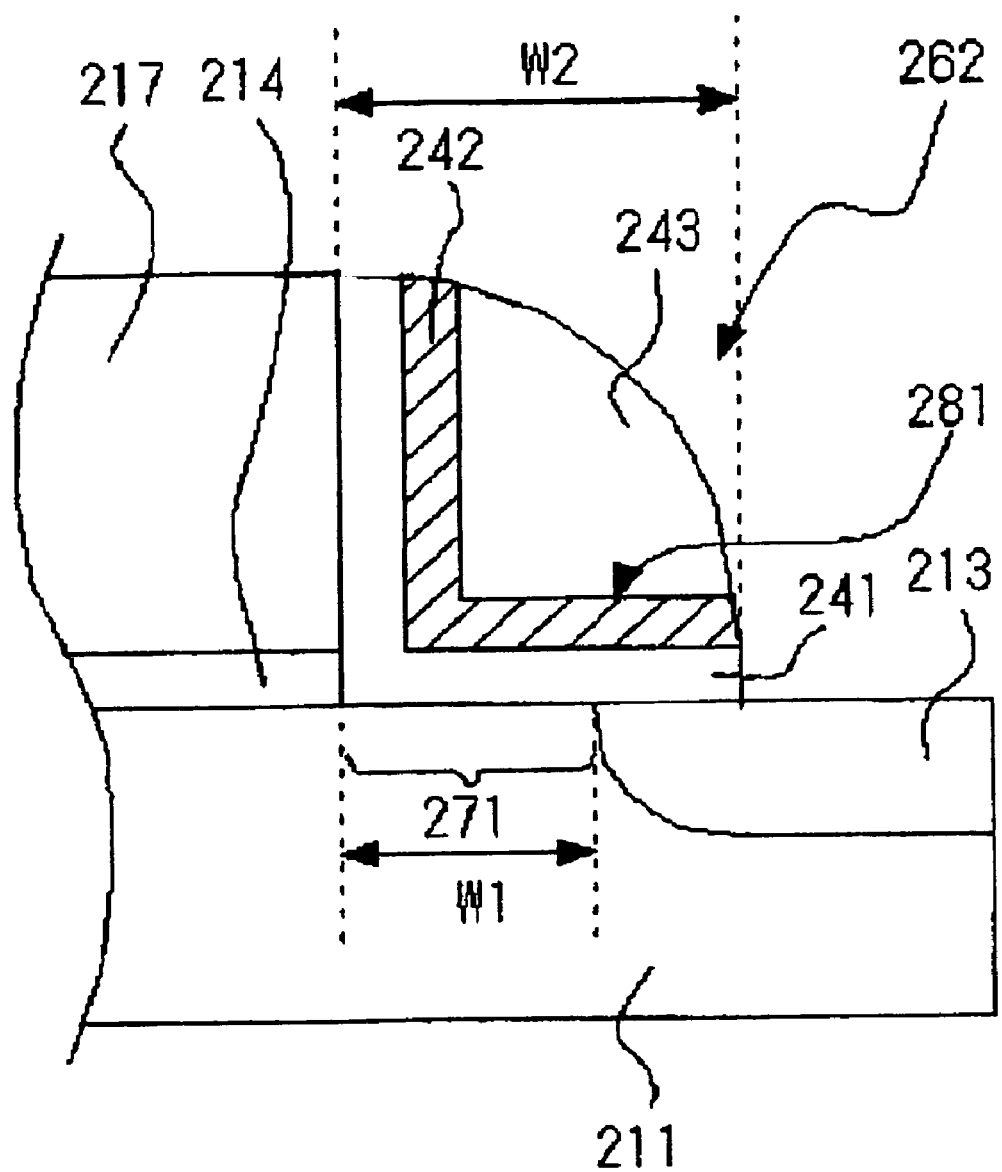
FIG. 9 is an enlarged schematic sectional view showing a main part of FIG. 8.

As shown in FIG. 9, in the area around the memory functional element 262, when an offset amount between the gate electrode 217 and the diffusion region 213 is W1 and the width of the memory functional element 262 in a cutting plane in the channel length direction of the gate electrode is W2, an overlap amount between the memory functional element 262 and the diffusion region 213 is expressed by "W2−W1". It is important that the silicon nitride film 242 in the memory functional element 262 overlaps the diffusion region 213, that is, the relation of "W2>W1" is satisfied.

In FIG. 9, since the end on the side apart from the gate electrode 217, of the silicon nitride film 242 in the memory functional element 262 coincides with the end of the memory functional element 262 on the side apart from the gate electrode 217, the width of the memory functional element 262 is defined as W2.

Figure 10:
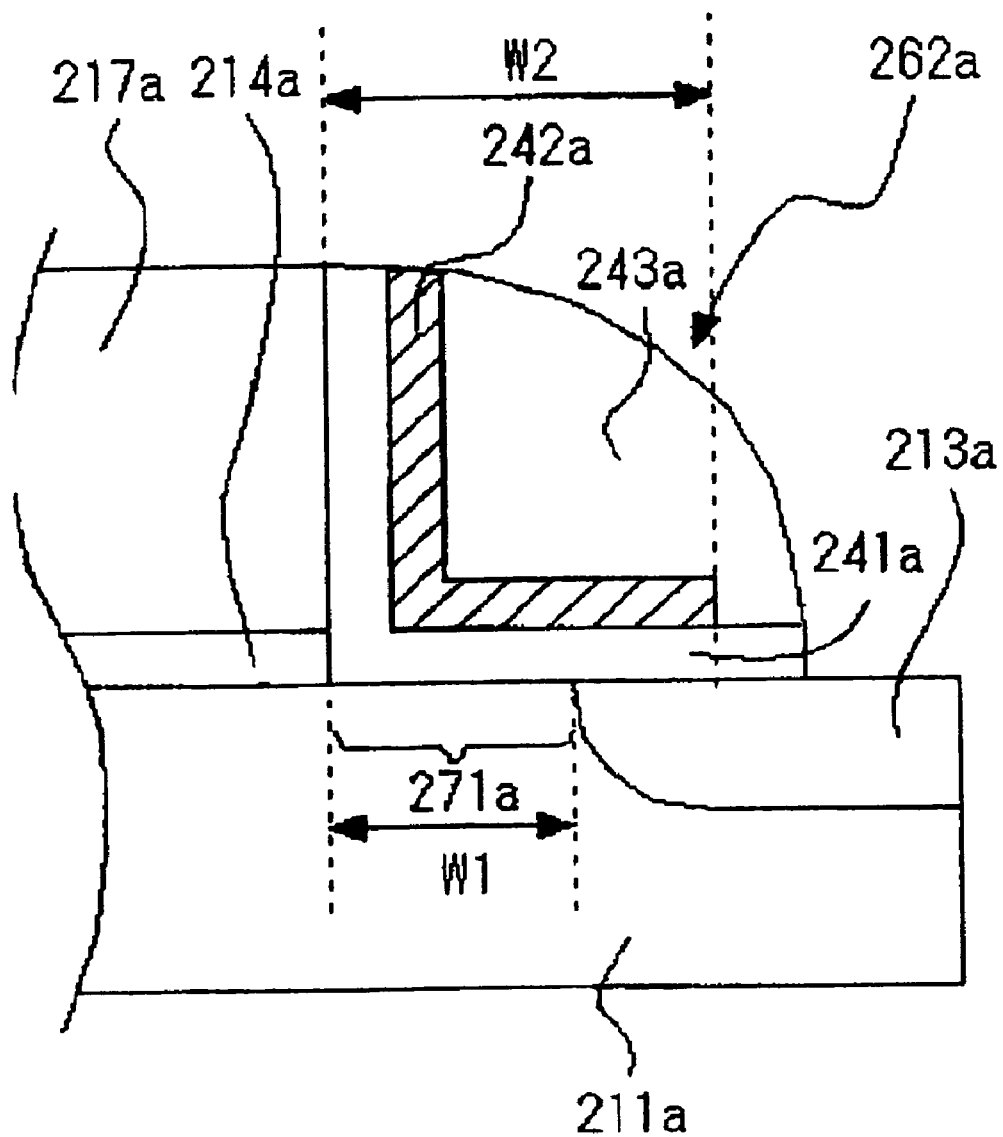
FIG. 10 is an enlarged schematic sectional view showing a main part of a modification of FIG. 8.

As shown in FIG. 10, when the end on the side apart from a gate electrode 217a, of a silicon nitride film 242a in a memory functional element 262a does not coincide with the end of the memory functional element 262a on the side apart from the gate electrode 217a, W2 may be defined as a width from the end of the gate electrode to the end on the side apart from the gate electrode of the silicon nitride film 242a.

Figure 11:
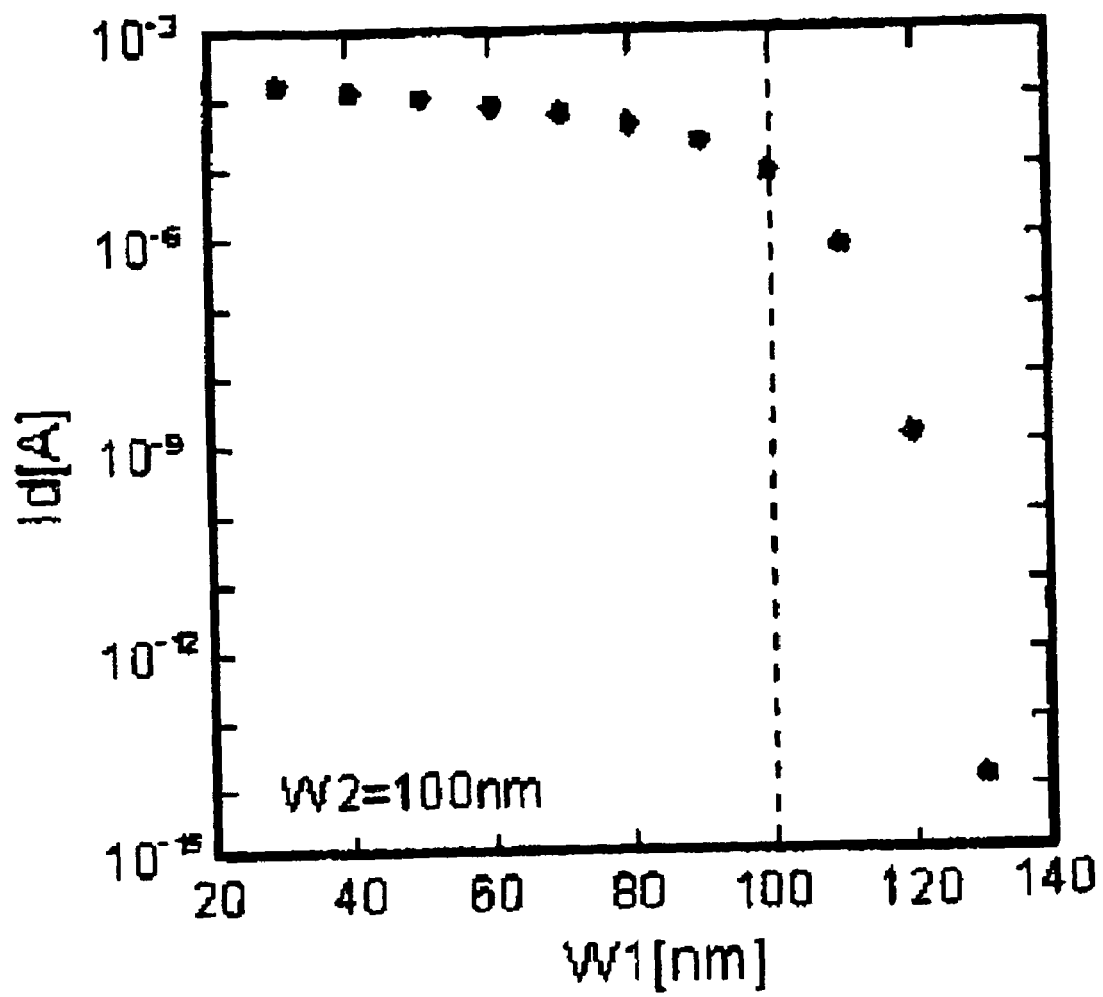
FIG. 11 is a graph showing electric characteristics of the memory cell (second embodiment) in the semiconductor memory device of the present invention.

FIG. 11 shows drain current Id when the width W2 of the memory functional element 262 is fixed to 100 nm and the offset amount W1 is changed in the structure of the memory cell of FIG. 9. The drain current was obtained by device simulation on assumption that the memory functional element 262 is in erasing state (holes are accumulated), and the diffusion regions 212 and 213 serve as the source electrode and the drain electrode, respectively.

As obvious from FIG. 11, when W1 is 100 nm or more (that is, the silicon nitride film 242 and the diffusion region 213 do not overlap with each other), the drain current sharply decreases. Since the drain current value is almost proportional to the read operation speed, the performance of the memory sharply deteriorates when W1 is 100 nm or more. On the other hand, in the range where the silicon nitride film 242 and the diffusion region 213 overlap with each other, decrease in the drain current is gentle. Therefore, in the case of considering also variations in mass production, without overlap between at least a part of the silicon nitride film 242 as the film having the function of retaining charges and the source and drain regions, it is difficult to actually obtain the memory function.

On the basis of the result of the device simulation, by fixing W2 to 100 nm and setting W1 to 60 nm and 100 nm as design values, memory cell arrays were produced. In the case where W1 is 60 nm, the silicon nitride film 242 and each of the diffusion regions 212 and 213 overlap with each other by 40 nm as a design value. In the case where W1 is 100 nm, there is no overlap as a design value. Reading time of the memory cell arrays was measured and worst cases in which variations were considered were compared with each other. In the case where W1 was set to 60 nm as a design value, read access time was 100 times as fast as that of the other case. In practice, the read access time is preferably 100 n/sec or less per one bit. When W1=W2, this condition cannot be satisfied. In the case of considering manufacture variations as well, it is more preferable that (W2−W1) >10 nm be satisfied.

In reading of information stored in the memory functional element 261 (region 281), in a manner similar to the first embodiment, it is preferable to set the diffusion region 212 as a source region, set the diffusion region 213 as a drain region, and form a pinch-off point on the side closer to the drain region in the channel region. Specifically, at the time of reading information stored in one of two memory functional elements, it is preferable to form a pinch-off point in a region close to the other memory functional element in the channel region. With the configuration, irrespective of the storage state of the memory functional element 262, information stored in the memory functional element 261 can be detected with high sensitivity, and it enables a 2-bit operation to be performed.

On the other hand, in the case of storing information in only one of two memory functional elements or in the case of using two memory functional elements in the same storage state, it is not always necessary to form a pinch-off point at the time of reading.

Although not shown in FIG. 8, it is preferable to form a well region (P-type well in the case of an N-channel device) in the surface of the semiconductor substrate 211. By forming the well region, while optimizing the impurity concentration in the channel region to memory operations (rewriting operation and reading operation), the other electric characteristics (withstand voltage, junction capacitance and short channel effect) can be controlled more easily.

Figure 12:
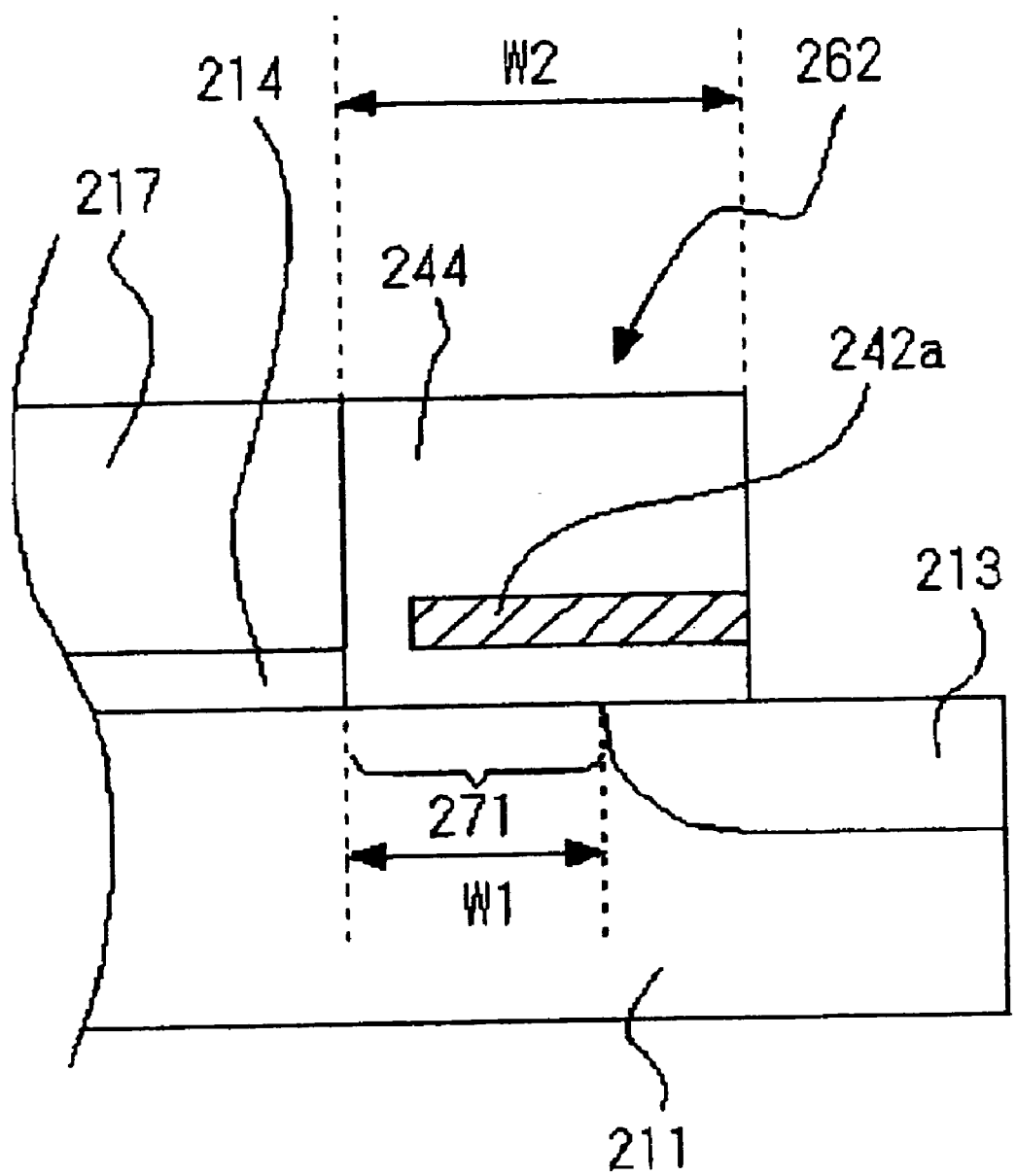
FIG. 12 is a schematic sectional view showing a main part of a modification of the memory cell (second embodiment) in the semiconductor memory device of the present invention.

Preferably, the memory functional element includes the charge retaining film which is disposed almost parallel with the surface of the gate insulating film. In other words, it is preferable to dispose the memory functional element so that the top surface of the charge retaining film in the memory functional element is positioned in a distance equal from the top surface of the gate insulating film. Specifically, as shown in FIG. 12, the silicon nitride film 242a as the charge retaining film in the memory functional element 262 has a surface almost parallel with the surface of the gate insulating film 214. In other words, it is preferable that the silicon nitride film 242a be formed at a constant level from the level of the surface of the gate insulating film 214.

Because of the existence of the silicon nitride film 242a which is almost parallel with the surface of the gate insulating film 214 in the memory functional element 262, easiness of formation of an inversion layer in the offset region 271 can be effectively controlled in accordance with the amount of charges accumulated in the silicon nitride film 242a and, moreover, the memory effect can be increased. By forming the silicon nitride film 242a almost parallel with the surface of the gate insulating film 214, even in the case where the offset amount (W1) varies, a change in the memory effect can be maintained to be relatively small and variations in the memory effect can be suppressed. Moreover, movement of charges to the upper portion in the silicon nitride film 242a is suppressed and occurrence of a characteristic change due to movement of charges during retention of information can be suppressed.

Further, it is preferable that the memory functional element 262 include an insulating film (for example, a portion over the offset region 271 in the silicon oxide film 244) for separating the silicon nitride film 242a which is almost parallel to the surface of the gate insulating film 214 from the channel region (or well region). By the insulating film, dissipation of the charges accumulated in the charge retaining film is suppressed and a memory cell having a better retaining characteristic can be obtained.

By controlling the thickness of the silicon nitride film 242a and controlling the thickness of the insulating film below the silicon nitride film 242a (portion over the offset region 271 in the silicon oxide film 244) to be constant, the distance from the surface of the semiconductor substrate to charges accumulated in the charge retaining film can be maintained almost constant. To be specific, the distance from the surface of the semiconductor substrate to the charges accumulated in the charge retaining film can be controlled to be in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the memory cell can be reduced very much.

Third Embodiment

Figure 13:
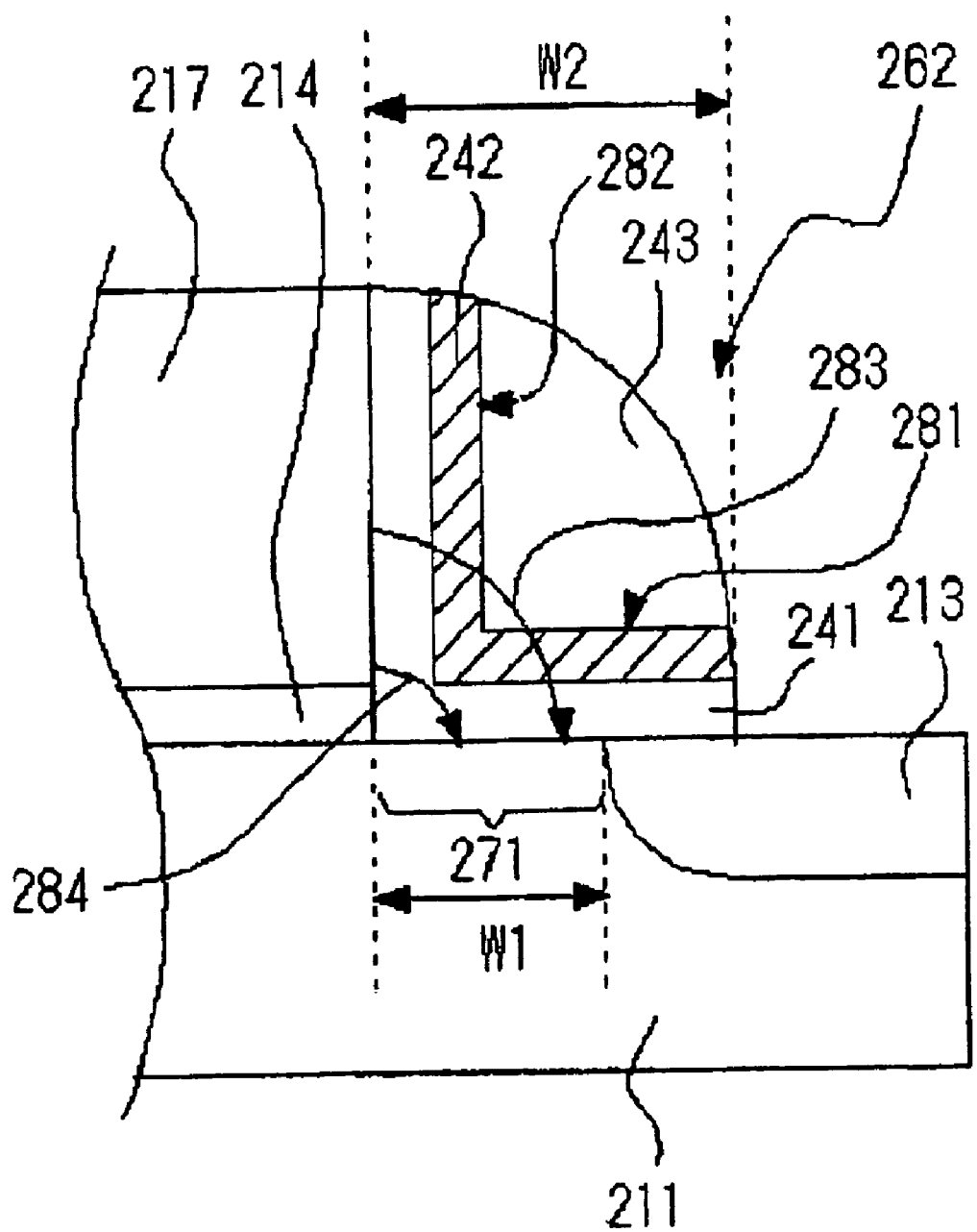
FIG. 13 is a schematic sectional view showing a main part of a memory cell (third embodiment) in the semiconductor memory device of the present invention.

The memory functional element 262 in a semiconductor memory device of a third embodiment has a shape in which, as shown in FIG. 13, the silicon nitride film 242 as the charge retaining film has an almost constant thickness and is disposed almost parallel with the surface of the gate insulating film 214 (region 281) and, further, disposed almost parallel with a side surface of the gate electrode 217 (region 282).

In the case where a positive voltage is applied to the gate electrode 217, an electric line 283 of force in the memory functional element 262 passes through the silicon nitride film 242 twice (portions corresponding to the regions 282 and 281) as shown by the arrows. When a negative voltage is applied to the gate electrode 217, the direction of the electric line of force is reversed. The dielectric constant of the silicon nitride film 242 is about 6 and the dielectric constant of the silicon oxide films 241 and 243 is about 4. Therefore, as compared with the case where only the region 281 of the charge regaining film exists, the effective dielectric constant of the memory functional element 262 in the direction of the electric line 283 of force becomes high and the potential difference at both ends of the electric line of force can be reduced. That is, the most of the voltage applied to the gate electrode 217 is used to increase the electric field in the offset region 271.

The reason why charges are injected into the silicon nitride film 242 at the time of the rewriting operation is because generated charges are attracted by the electric field in the offset region 271. Therefore, by including the charge retaining film indicated by the arrow 282, charges injected into the memory functional element 262 increases in the rewriting operation, and the rewrite speed increases.

In the case where the portion of the silicon oxide film 243 is also a silicon nitride film, specifically, when the charge retaining film is not constant with respect to the level of the surface of the gate insulating film 214, movement of charges to the upper portion of the silicon nitride film becomes conspicuous and the retaining characteristic deteriorates.

More preferably, in place of the silicon nitride film, the charge retaining film is made of a high dielectric such as hafnium oxide having a very high dielectric constant.

Preferably, the memory functional element further includes an insulating film (portion over the offset region 271 in the silicon oxide film 241) for separating the charge retaining film which is almost parallel with the surface of the gate insulating film from the channel region (or well region). By the insulating film, dissipation of charges accumulated in the charge retaining film is suppressed and the retaining characteristic can be further improved.

Preferably, the memory functional element further includes an insulating film (a portion in contact with the gate electrode 217 in the silicon oxide film 241) for separating the gate electrode from the charge retaining film extended almost parallel with the side face of the gate electrode. The insulating film prevents injection of charges from the gate electrode into the charge retaining film and, accordingly, prevents a change in the electric characteristics. Thus, the reliability of the memory cell can be improved.

Further, in a manner similar to the second embodiment, it is preferable to control the thickness of the insulating film under the silicon nitride film 242 (the portion over the offset region 271 of the silicon oxide film 241) to be constant and to control the thickness of the insulating film disposed on the side surface of the gate electrode (the portion in contact with the gate electrode 217 in the silicon oxide film 241) to be constant. By the operation, the density of electric lines of force generated by the charges accumulated in the silicon nitride film 242 can be controlled more or less and leakage of charges can be prevented.

Fourth Embodiment

In a fourth embodiment, optimization of distances among the gate electrode, the memory functional element, and the source and drain regions of a memory cell in a semiconductor memory device will be described.

Figure 14:
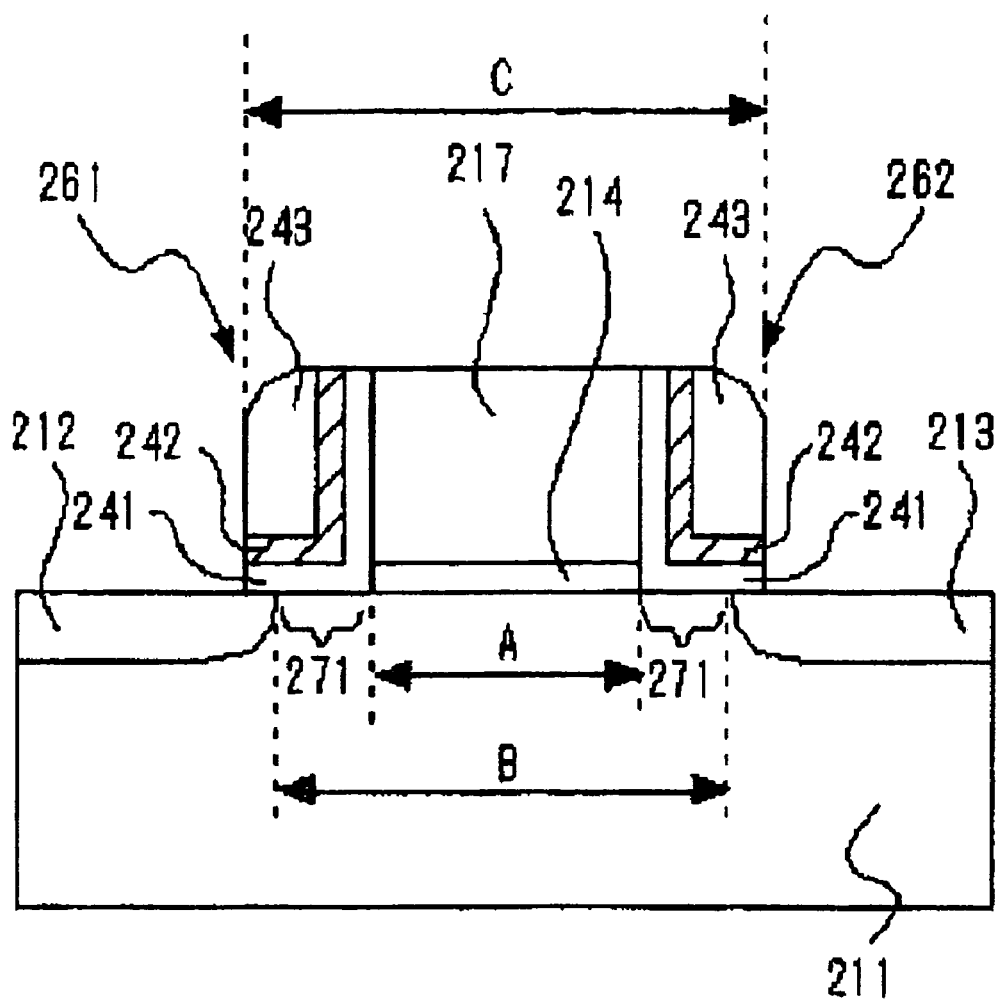
FIG. 14 is a schematic sectional view showing a main part of a memory cell (fourth embodiment) in the semiconductor memory device of the present invention.

As shown in FIG. 14, A indicates the length of the gate electrode in a cutting plane in the channel length direction, B indicates the distance from the source and drain regions (channel length), and C indicates the distance between an end of one of memory functional elements to an end of the other memory functional element, that is, the distance from an end (on the side apart from the gate electrode) of the film having the function of retaining charges in one of the memory functional elements in a cutting plane in the channel length direction to an end (on the side apart from the gate electrode) of the film having the function of retaining charges in the other memory functional element.

In such a memory cell, B<C is preferable. By satisfying such a relation, the offset regions 271 exist between the portion under the gate electrode 217 in the channel region and each of the diffusion regions 212 and 213. Consequently, easiness of inversion effectively fluctuates in the whole offset regions 271 by charges accumulated in the memory functional elements 261 and 262 (silicon nitride films 242). Therefore, the memory effect increases and, particularly, higher-speed reading operation is realized.

In the case where there is an offset between the gate electrode 217 and each of the diffusion regions 212 and 213, that is, in the case where the relation of A<B is satisfied, easiness of inversion of the offset region when a voltage is applied to the gate electrode largely changes according to an amount of charges accumulated in the memory functional element, the memory effect increases, and a short channel effect can be reduced.

As long as the memory effect is produced, the offset region 271 does not always have to exist. Even in the case where the offset region 271 does not exist, if the impurity concentration in the diffusion regions 212 and 213 is sufficiently low, the memory effect can be produced in the memory functional elements 261 and 262 (silicon nitride film 242).

Thus, A<B<C is the most preferred.

Fifth Embodiment

Figure 15:
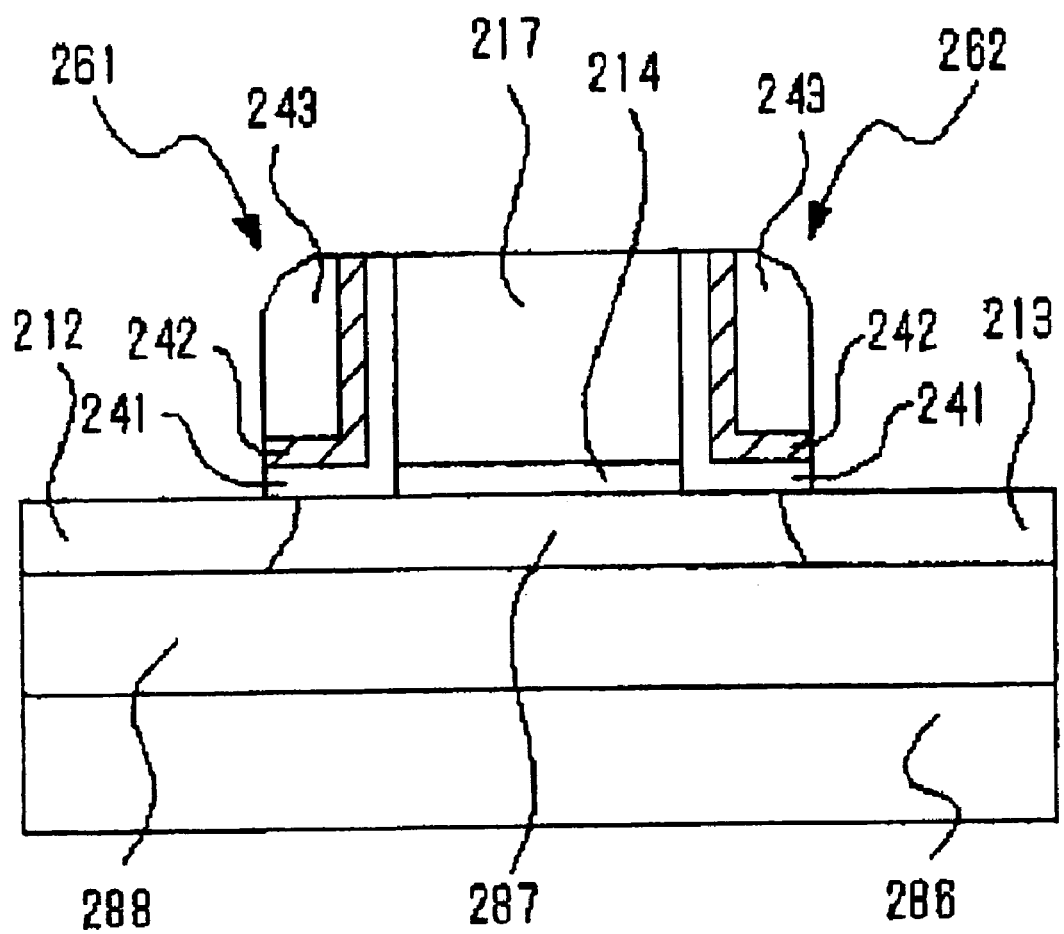
FIG. 15 is a schematic sectional view showing a main part of a memory cell (fifth embodiment) in the semiconductor memory device of the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region serves as a body region 287.

By the memory cell as well, action and effect similar to those of the memory cell of the second embodiment are produced. Further, junction capacitance between the diffusion regions 212 and 213 and the body region 287 can be remarkably reduced, so that higher-speed operation and lower power consumption of the device can be achieved.

Sixth Embodiment

Figure 16:
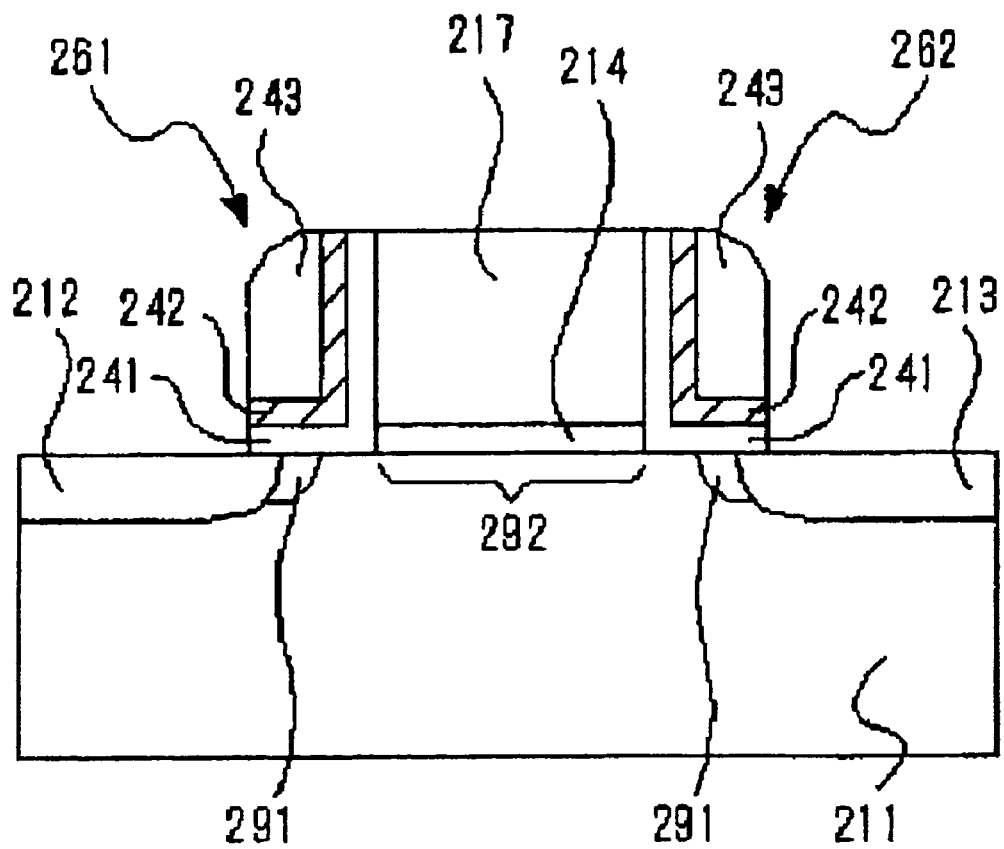
FIG. 16 is a schematic sectional view showing a main part of a memory cell (sixth embodiment) in the semiconductor memory device of the present invention.

A memory cell in a semiconductor memory device in a sixth embodiment has, as shown in FIG. 16, a configuration substantially similar to that of the memory cell of the second embodiment except that P-type high-concentration regions 291 are added adjacent to the channel sides of the N-type diffusion regions 212 and 213.

Specifically, the concentration of P-type impurity (for example, boron) in the P-type high-concentration region 291 is higher than that in a region 292. Proper P-type impurity concentration in the P-type high-concentration region 291 is, for example, about $5\times10^{17}$ to $1\times10^{19}$ cm$^{-3}$. The P-type impurity concentration in the region 292 can be, for example, $5\times10^{16}$ to $1\times10^{18}$ cm$^{-3}$.

By providing the P-type high-concentration region 291 as described above, the gradient of potential in the junction between the diffusion regions 212 and 213 and the semiconductor substrate 211 becomes sharp immediately below the memory functional elements 261 and 262. Consequently, hot carriers are easily generated in the programming and erasing operations, and voltages in the programming and erasing operations are decreased, or the programming and erasing operations can be performed at high speed. Further, the impurity concentration in the region 292 is relatively low, so that the threshold when the memory is an erased state is low, and the drain current increases. Consequently, reading speed is improved. Therefore, the memory cell in which the rewriting voltage is low or rewriting speed is high and the reading speed is high can be obtained.

In FIG. 16, by providing the P-type high-concentration region 291 in the vicinity of the source/drain region and below the memory functional element (that is, not immediately below the gate electrode), the threshold of the transistor as a whole increases noticeably. The degree of increase is much higher as compared with the case where the P-type high-concentration region 291 exists immediately below the gate electrode. In the case where program charges (electrons in the case where the transistor is of the N-channel type) are accumulated in the memory functional element, the difference becomes much larger. On the other hand, when sufficient erase charges (positive holes in the case where the transistor is of the N channel type) are accumulated in the memory functional element, the threshold of the transistor as a whole decreases to the threshold determined by the impurity concentration in the channel region (region 292) below the gate electrode. That is, the threshold at the time of erasing does not depend on the impurity concentration in the P-type high-concentration region 291. On the other hand, the threshold at the time of programming is largely influenced by the impurity concentration. Therefore, by disposing the P-type high-concentration region 291 below the memory functional element and in the vicinity of the source/drain region, only the threshold at the time of programming fluctuates very largely and the memory effect (the difference between the threshold at the time of programming and the threshold at the time of erasing) can be remarkably increased.

Seventh Embodiment

Figure 17:
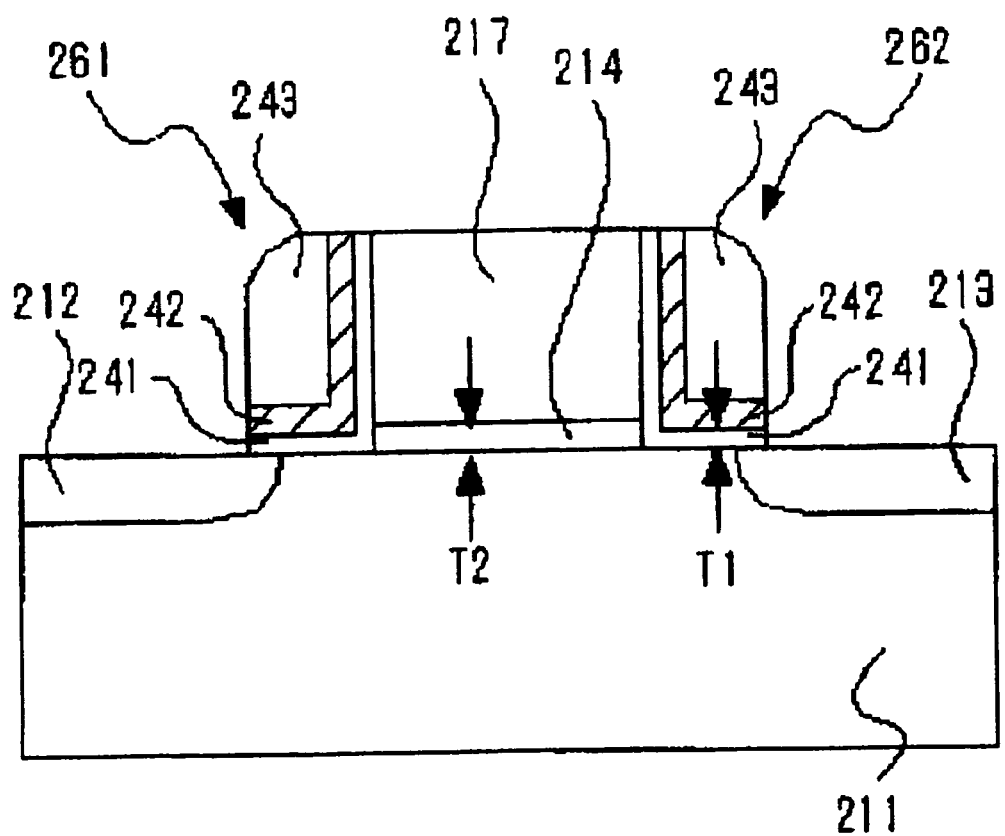
FIG. 17 is a schematic sectional view showing a main part of a memory cell (seventh embodiment) in the semiconductor memory device of the present invention.

A memory cell in a semiconductor memory device of a seventh embodiment has a configuration substantially similar to that of the second embodiment except that, as shown in FIG. 17, the thickness (T1) of an insulating film for separating the charge retaining film (silicon nitride film 242) from the channel region or well region is smaller than the thickness (T2) of the gate insulating film.

The lower limit value exists in the thickness T2 of the gate insulating film 214 due to the demand for a withstand voltage at the time of memory rewriting operation. In contrast, the thickness T1 of the insulating film can be made smaller than the thickness T2 irrespective of the demand for a withstand voltage.

The flexibility of designing with respect to T1 is high in the memory cell for the following reason.

In the memory cell, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand for a withstand voltage to the gate insulating film, T1 can be made smaller than T2.

By making T1 thinner, injection of charges into the memory functional element becomes easier, and the voltage of the programming operation and the erasing operation can be decreased or the programming operation and erasing operation can be performed at high speed. Since the amount of charges induced by the channel region or well region when charges are accumulated in the silicon nitride film 242 increases, the memory effect can be increased.

The electric lines of force in the memory functional element include a short one which does not pass through the silicon nitride film 242 as shown by an arrow 284 in FIG. 13. On the relatively short electric line of force, electric field intensity is relatively high, so that the electric field along the electric line of force plays a big role in the rewriting operation. By reducing T1, the silicon nitride film 242 is shifted downward in the diagram, and the electric line of force indicated by the arrow 283 passes through the silicon nitride film. Consequently, the effective dielectric constant in the memory functional element along the electric line 284 of force increases, and the potential difference at both ends of the electric line of force can be further decreased. Therefore, a large part of the voltage applied to the gate electrode 217 is used to increase the electric field in the offset region, and the programming operation and the erasing operation become faster.

In contrast, for example, in an EEPROM typified by a flash memory, the insulating film for separating the floating gate from the channel region or well region is sandwiched by the gate electrode (control gate) and the channel region or well region, so that a high electric field from the gate electrode directly acts. Therefore, in an EEPROM, the thickness of the insulating film for separating the floating gate from the channel region or well region is regulated, and optimization of the function of the memory cell is inhibited.

As obvious from the above, by satisfying the relation of T1<T2, without deteriorating the performance of the withstand voltage of the memory, the voltage in the programming and erasing operations can be decreased or the programming and erasing operations can be performed at high speed and, further, the memory effect can be increased. The thickness T1 of the insulating film is preferably 0.8 nm or more as a limit at which the uniformity and the film quality in the manufacturing process can maintain a predetermined level and the retaining characteristic does not deteriorate extremely.

Specifically, in the case of a liquid crystal driver LSI requiring high withstand voltage in a design rule, in order to drive the liquid crystal panel TFT, a voltage of 15 to 18 V at the maximum is required, so that the gate oxide film cannot be usually thinned. In the case of mounting a nonvolatile memory of the present invention for image adjustment on the liquid crystal driver LSI, in the memory cell of the present invention, the thickness of the insulating film for separating the charge retaining film (silicon nitride film 242) from the channel region or well region can be optimally designed independently of the thickness of the gate insulating film. For example, the thickness can be individually set as T1=20 nm and T2=10 nm for a memory cell having a gate electrode length (word line width) of 250 nm, so that a memory cell having high programming efficiency can be realized (the reason why the short channel effect is not produced when T1 is larger than the thickness of a normal logic transistor is because the source and drain regions are offset from the gate electrode).

Eighth Embodiment

Figure 18:
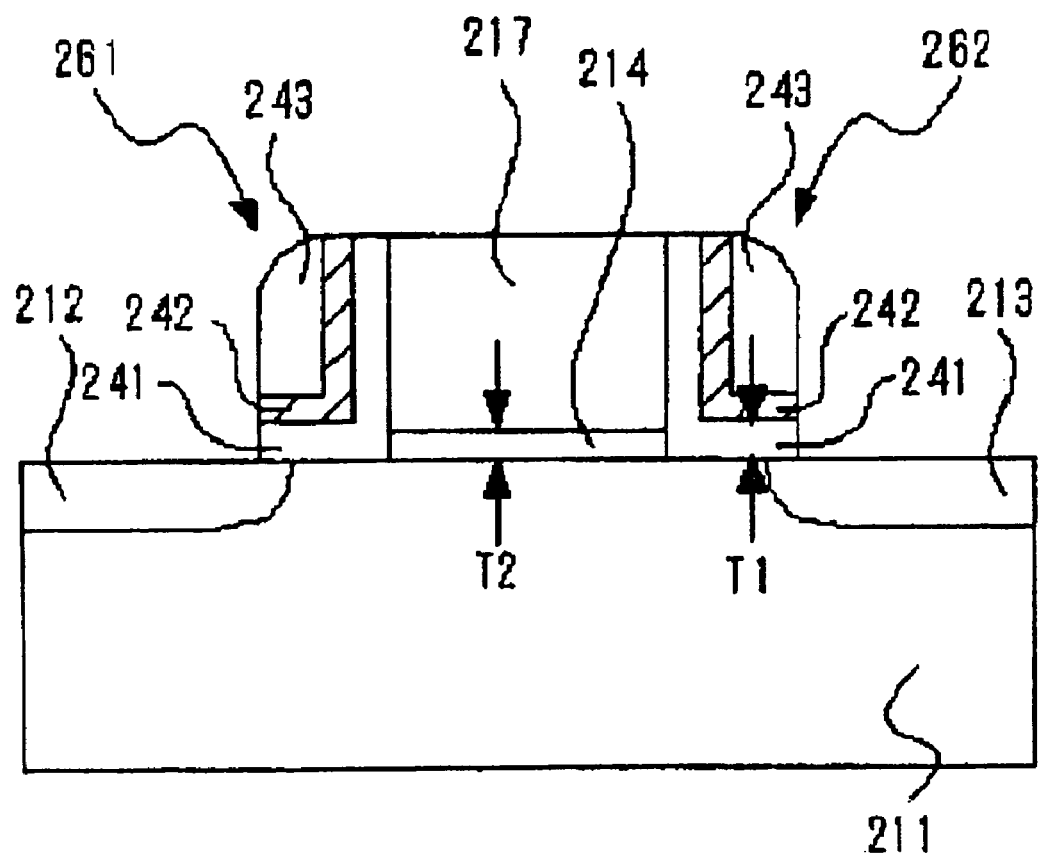
FIG. 18 is a schematic sectional view showing a main part of a memory cell (eighth embodiment) in the semiconductor memory device of the present invention.

A memory cell in a semiconductor memory device of an eighth embodiment has a configuration substantially similar to that of the second embodiment except that, as shown in FIG. 18, the thickness (T1) of the insulating film for separating the charge retaining film (silicon nitride film 242) from the channel region or well region is larger than the thickness (T2) of the gate insulating film.

The upper limit value exists in the thickness T2 of the gate insulating film 214 due to the demand for preventing a short channel effect of the device. In contrast, the thickness T1 of the insulating film can be made larger than the thickness T2 irrespective of the demand for preventing a short channel effect. Specifically, when microfabrication scaling advances (when thinning of the gate insulating film advances), the thickness of the insulating film for separating the charge retaining film (silicon nitride film 242) from the channel or well region can be optimally designed independently of the thickness of the gate insulating film. Thus, an effect that scaling is not disturbed by the memory functional element is produced.

The reason why flexibility of designing of T1 is high in the memory cell is that, as described already, the insulating film for separating the charge retaining film from the channel region or well region is not sandwiched by the gate electrode and the channel region or well region. Consequently, irrespective of the demand for preventing the short channel effect for the gate insulating film, T1 can be made larger than T2. By making T1 thicker, dissipation of charges accumulated in the memory functional element can be prevented and the retaining characteristic of the memory can be improved.

Therefore, by satisfying the relation of T1>T2, the retaining characteristic can be improved without deteriorating the short channel effect of the memory.

The thickness T1 of the insulating film is preferably 20 nm or less in consideration of decrease in the rewriting speed.

Specifically, in a conventional nonvolatile memory typified by a flash memory, a selection gate electrode serves as a program/erase gate electrode, and a gate insulating film (including a floating gate) corresponding to the program/erase gate electrode also serves as a charge accumulating film. Since a demand for size reduction (thinning of a film is indispensable to suppress short channel effect) and a demand for assuring reliability (to suppress leak of retained charges, the thickness of the insulating film for separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, thereby enabling a memory cell in which the short channel effect is not produced to be realized. The reason why the short channel effect is not produced even when T2 is set to be larger than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting programming and erasing does not exist in the upper portion of the memory functional element, a high electric field acting between the electrode for assisting programming and erasing and the channel region or well region does not directly act on the insulating film for separating the charge retaining film from the channel region or well region, but only a relatively low electric field which spreads in the lateral direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
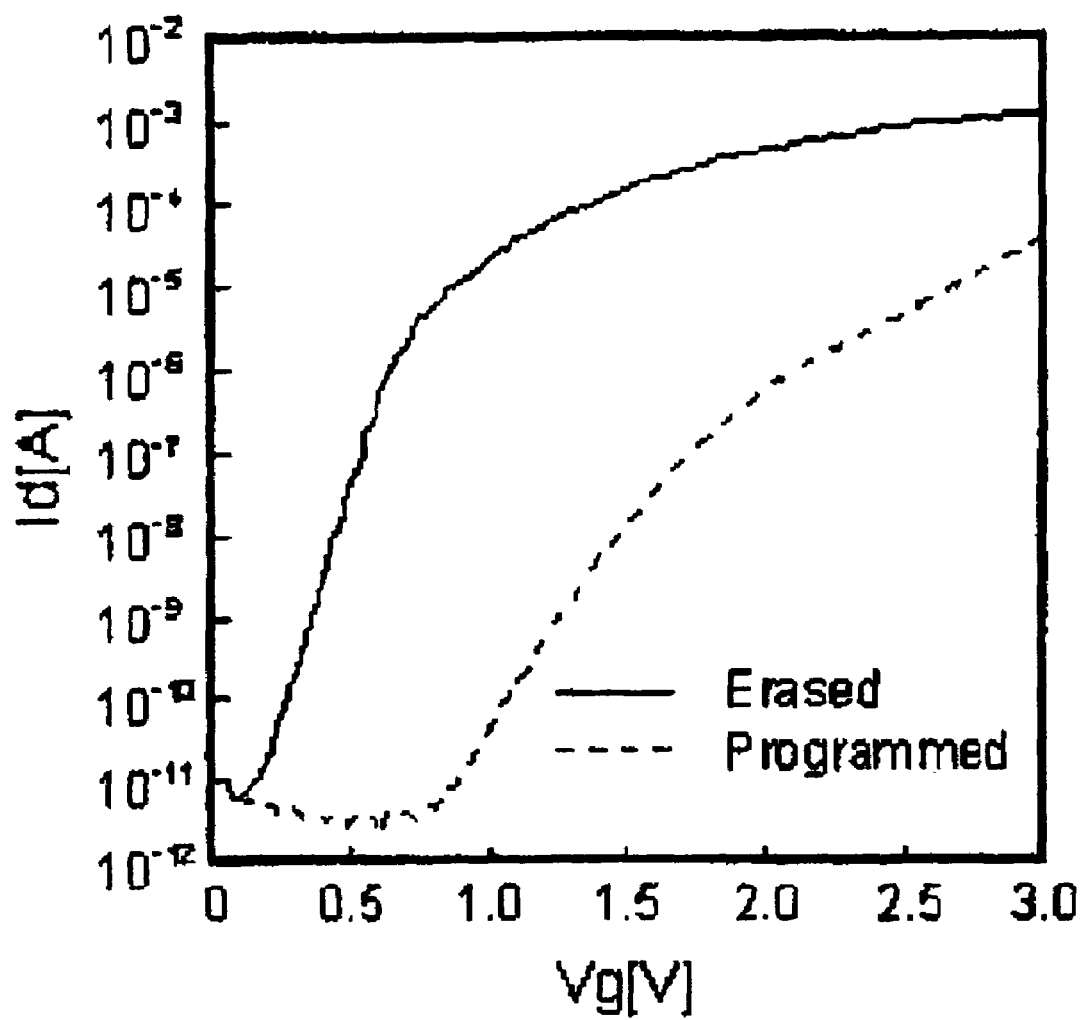
FIG. 19 is a graph showing electric characteristics of a memory cell (ninth embodiment) in the semiconductor memory device of the present invention.

In an N-channel type memory cell, when an amount of charges in a memory functional element changes, a drain current (Id)-gate voltage (Vg) characteristic (actual measurement value) as shown in FIG. 19 is exhibited.

Figure 32:
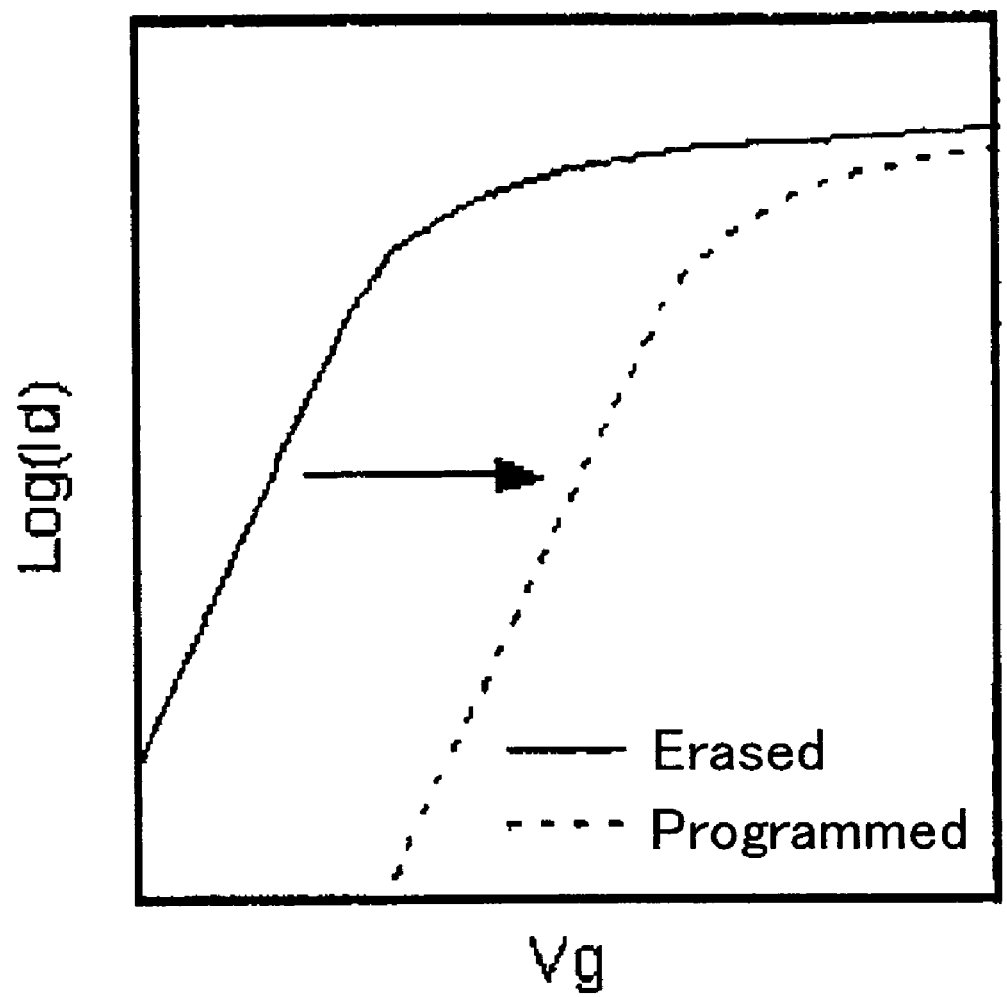
FIG. 32 is a graph showing electric characteristics of the conventional flash memory.

As obvious from FIG. 19, in the case of performing a programming operation in an erasing state (solid line), not only the threshold simply increases, but the gradient of a graph remarkably decreases in a sub-threshold region. Consequently, also in a region where a gate voltage (Vg) is relatively high, the drain current ratio between the erasing state and the programming state is high. For example, also at Vg=2.5 V, the current ratio of two digits or more is maintained. The characteristic is largely different from that in the case of a flash memory (FIG. 32).

The appearance of such a characteristic is a peculiar phenomenon which occurs when the gate electrode and the diffusion regions are offset from each other and the gate electric field hardly acts on the offset region. When the memory cell is in a programming state, even if a positive voltage is applied to the gate electrode, an inversion layer is hardly generated in the offset region below the memory functional element. This is the cause that the gradient of the Id-Vg curve in the sub-threshold region becomes gentle in the programming state.

On the other hand, when the memory cell is in the erasing state, electrons of high density are induced in the offset region. Further, when 0 V is applied to the gate electrode (that is, when the gate electrode is in an off state), no electrons are induced in the channel below the gate electrode (consequently, an off-state current is small). This is the cause that the gradient of the Id-Vg curve is sharp in the sub-threshold region in the erasing state, and current increasing rate (conductance) is high also in the region of the threshold or more.

As obviously understood from the above, in the memory cell in the semiconductor memory device of the present invention, the drain current ratio between the programming operation and the erasing operation can be particularly made high.

Tenth Embodiment

A tenth embodiment relates to a configuration of a memory cell array obtained by arranging a plurality of the memory cells of any of the first to eighth embodiments in a matrix of rows and columns.

Figure 20:
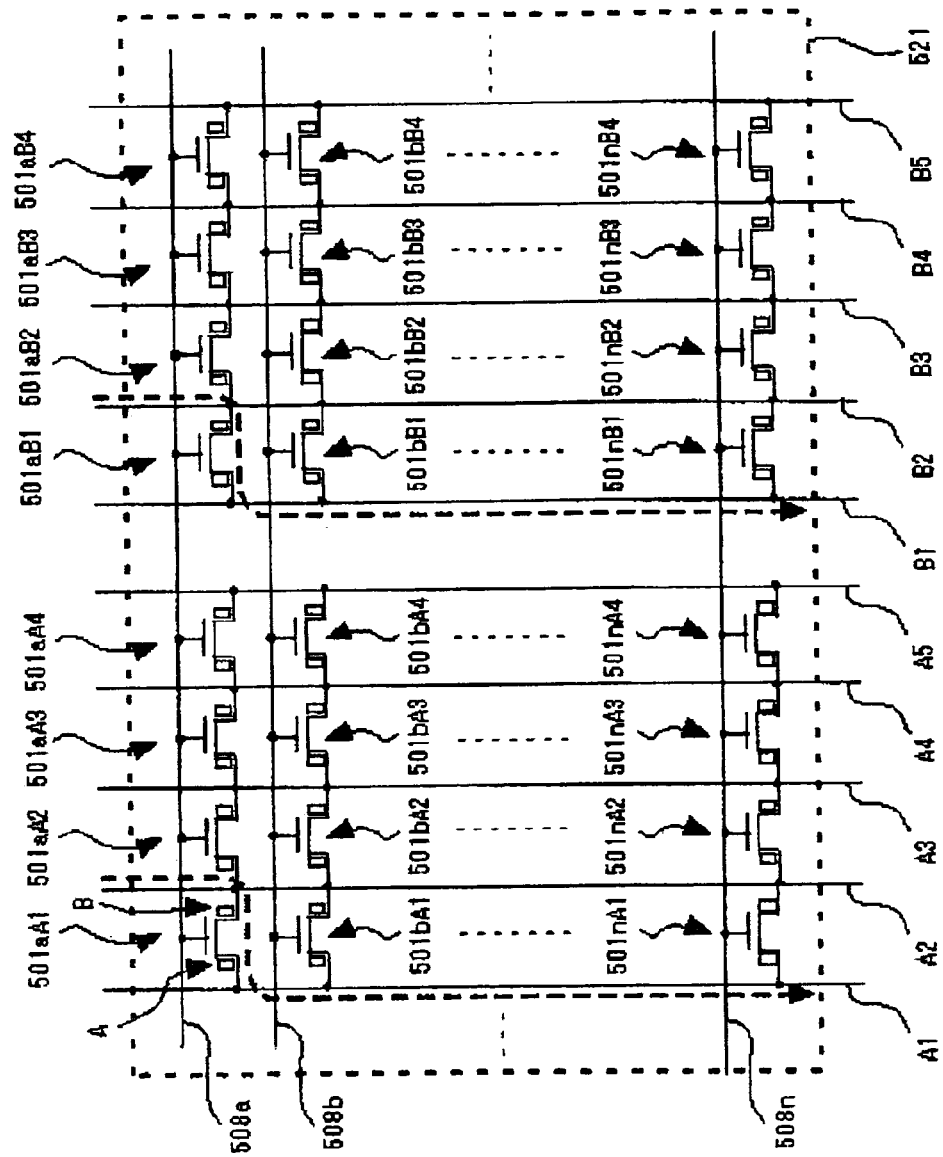
FIG. 20 is a circuit diagram showing a configuration example of a memory cell array in a semiconductor memory device (tenth embodiment) of the present invention.

FIG. 20 shows an example of the configuration of a memory cell array 521. In FIG. 20, 501aA1 to 501aA4, 501aB1 to 501aB4, . . . , and 501nB1 to 501nB4 denote memory cells, 508a to 508n denote word lines, and A1 to A5 and B1 to B5 denote bit lines. Each memory cell has two memory functional elements. In order to identify the memory functional elements, the arrows A and B are designated to the memory functional elements of only the memory cell 501aA1, but are omitted to the other memory cells.

In the memory cell array configuration of FIG. 20, a bit line is shared by memory cells belonging to neighboring columns, so that memory cells can be arranged at high packing density, and the configuration is adapted to an increase in the storage capacity. Specifically, the bit lines A2 to A4 and B2 to B4 are shared. Although memory cells in four columns construct one block in the embodiment, the present invention is not limited to the number of columns.

The bit lines correspond to first and second bit lines used for the programming, erasing and reading operations of the memory cell described with reference to FIGS. 3 to 7 in the first embodiment. Depending on the programming, erasing or reading operation performed on the two memory functional elements of a selected memory cell, one of the two bit lines connected to the selected memory cell serves as the first bit line and the other bit line serves as the second bit line. In each of the programming, erasing and reading operations, voltages applied to the word line and two bit lines connected to the selected memory cell are as described in the first embodiment and their description will not be repeated. In order to set the memory cell in a not-selected state, that is, to prevent the programming, erasing and reading operations from being performed, 0 V (the gate voltage by which a channel is not formed below the gate insulating film of the memory cell) is applied as the voltage on the word line and/or the voltage difference between the two bit lines connected to the memory cell is set to a voltage difference by which the programming, erasing and reading operations are not performed. Therefore, in the case of a not-selected memory cell connected to the same word line as the selected memory cell, a not-selected state is set by the latter method. In the case of a not-selected memory cell connected to the same bit line as the selected memory cell, a not-selected state is set by the former method. In the case of a not-selected memory cell which is not connected to the same word line and the same bit line as the selected memory cell, a not-selected state is set by both of the methods.

Although not shown, a circuit for driving a word line is connected to a word line so as to selectively apply a proper voltage to each of a selected memory cell and a not-selected memory cell in each of the programming, erasing and reading operations. To a bit line, a circuit for driving the bit line to selectively apply a proper voltage to each of the selected memory cell and the not-selected memory cell in each of the programming, erasing and reading operations, and a sense amplifier for sensing a drain current flowing in the second bit line and reading a storage state of the memory functional element in the reading operation are connected. The sense amplifier can be realized by applying a known differential amplifier or the like.

In the semiconductor memory device of the embodiment, as described above, a bit line is shared by memory cells belonging to neighboring columns, so that the packing density can be largely improved. As a result, the manufacturing cost is largely reduced and a cheap semiconductor memory device can be obtained. The configuration of the memory cell array in the semiconductor memory device of the present invention is not limited to the configuration shown in FIG. 20.

Preferably, in the semiconductor memory device of the embodiment, a logic transistor is also mounted on the same semiconductor chip.

Figure 21:
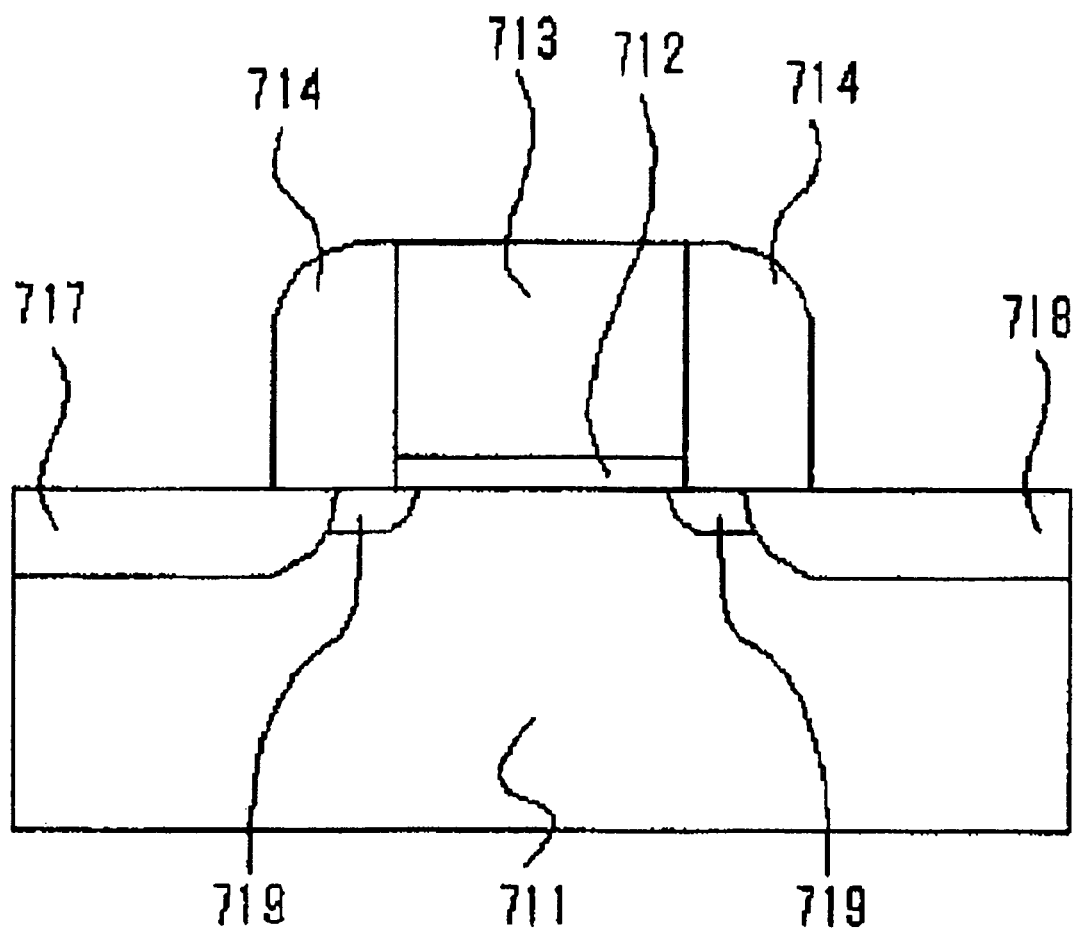
FIG. 21 is a schematic sectional view showing a main part of a normal transistor.

Since the procedure for forming the memory cell of the embodiment is very compatible with a normal standard transistor forming process, a process of forming both the semiconductor memory device or the memory cell and a logic transistor is very simple. In a standard transistor as a component of a logic circuit part and an analog circuit part, as shown in FIG. 21, usually, a gate electrode 713 having sidewall spacers 714 made by an insulating film on its side walls is formed over a semiconductor substrate 711 via a gate insulating film 712. A source region 717 and a drain region 718 are formed on both sides of the gate electrode 713. Each of the source region 717 and the drain region 718 has an LDD (Lightly Doped Drain) region 719. Therefore, the standard transistor has a configuration similar to that of a memory cell in the semiconductor memory device. In order to change the standard transistor to the memory cell, for example, the function of a memory functional element is given to the sidewall spacer 714 and it is unnecessary to form the LDD region 719.

More specifically, it is sufficient to change the sidewall spacer 714 to have a structure similar to, for example, the memory functional elements 261 and 262 in FIG. 8. At this time, the ratio of thicknesses among the silicon oxide films 241 and 243 and the silicon nitride film 242 can be properly adjusted so that the memory cell performs a proper operation. Even when the sidewall spacers of a transistor as a component of the standard logic part have a structure, for example, similar to those of the memory functional elements 261 and 262 of FIG. 8, as long as the width of the sidewall spacer (that is, the total film thickness of the silicon oxide films 241 and 243 and the silicon nitride film 242) is proper and the operation is performed in a voltage range in which the rewriting operation is not performed, the transistor performance does not deteriorate.

In order to form an LDD region in a transistor as a component of a standard logic part, it is sufficient to inject impurity for forming the LDD region after formation of a gate electrode and before formation of a memory functional element (sidewall spacer). Therefore, a memory cell and a standard transistor can be formed simultaneously and easily only by masking the memory cell with a photoresist at the time of injecting impurity for forming the LDD region.

A process of forming the conventional flash memory is largely different from that of a standard logic. Accordingly, as compared with the conventional case of using the flash memory as a nonvolatile memory and forming the flash memory simultaneously with a logic circuit and an analog circuit, in the semiconductor memory device of the present invention, the number of masks and the number of processes can be dramatically reduced. Consequently, the yield in manufacturing of a chip on which a logic circuit and an analog circuit are formed simultaneously with the nonvolatile memory cell is improved. Because of this, the manufacturing cost is reduced and, moreover, a very-reliable, cheap semiconductor memory device can be obtained.

Eleventh Embodiment

An eleventh embodiment of a semiconductor memory device according to the present invention will now be described. The semiconductor memory device having a memory cell array in which plural memory cells according to any of the first to eighth embodiments are arranged in a row direction and a column direction so as to form a matrix as shown in the tenth embodiment includes: memory operation circuit means, connected to the memory cell array, for executing a memory operation on the memory cell array; and command control means, connected to the memory operation circuit means, for receiving commands from an external user via a plurality of data terminals, and generating a predetermined control signal to the memory operation circuit means on the basis of the received command in order to control execution of the memory operation by the memory operation circuit means. Herein, the external user denotes an external device (such as a processor or other memory devices) connected to the semiconductor memory device of the present invention (hereinafter, appropriately referred to as "the inventive device") via an external data bus, an external address bus, and the like to use the inventive device.

Particularly, a command port structure of the inventive device will be described in detail. By the command port structure, a processor as an external user of programming, erasing, program-verifying, erase-verifying, and reading operation modes can be controlled.

In a preferred embodiment of the inventive device, as described above, a memory cell array is provided in which a plurality of memory cells according to any of the first to eighth embodiments are arranged in a row direction and a column direction so as to form a matrix as described in the tenth embodiment. By employing the characteristic circuit configuration of the inventive device and the memory cell array, a nonvolatile memory of high density and large capacity adapted to rewriting of stored information and controlled by an external processor is provided.

To realize control of memory operations such as programming and erasing by the external processor using a command while assuring direct terminal compatibility with an existing memory device such as an EPROM or EEPROM, a special circuit has to be used. In order to realize such terminal compatibility, the inventive device provides a command port structure enabling memory operations such as programming and erasing to be performed in a circuit of the inventive device. The command port structure realizes control of memory operations of programming, erasing, program-verifying, erase-verifying and reading by an external processor using a command to be performed while assuring direct terminal compatibility with an existing memory device. Such a dedicated command port structure is integrally formed in the same semiconductor chip as that in the inventive device.

Figure 22:
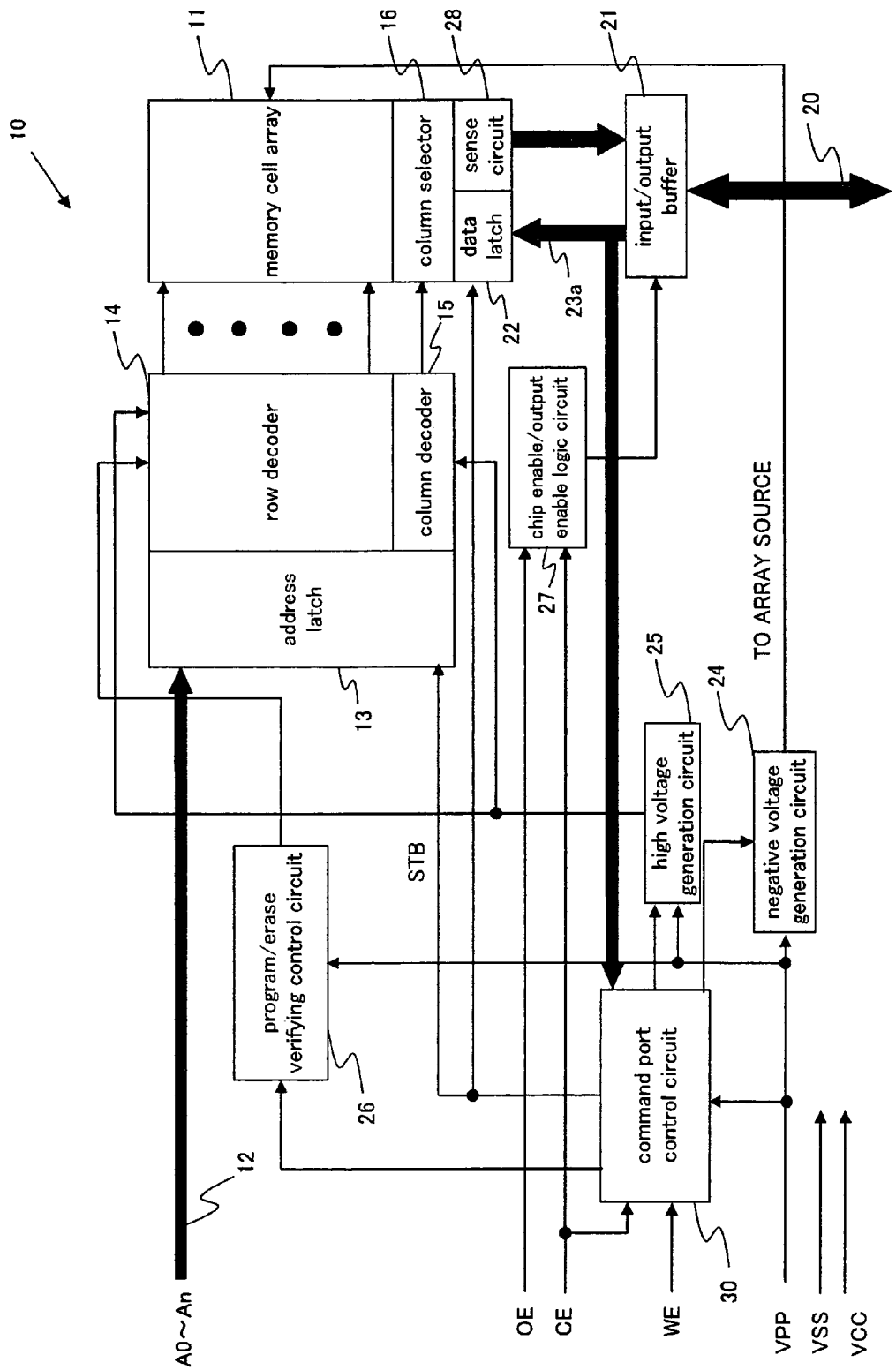
FIG. 22 is a block diagram showing a configuration example of a semiconductor memory device (eleventh embodiment) of the present invention.

FIG. 22 shows a block configuration of the inventive device 10. Address inputs A0 to An are connected to an address latch 13 via an address bus 12. On the address bus 12, address inputs have n+1 bits. Actually, the number of bits is set depending on the memory capacity of a memory cell array and bit width of data, and is changeable. The address latch 13 is connected to a row decoder 14 and a column decoder 15. The row decoder 14 is connected to a memory cell array 11, and the column decoder 15 is connected to a column selector 16. An access to the memory cell array 11 is realized when a row address is decoded by the row decoder 14, a column address is decoded by the column decoder 15, and a specific memory cell is selected by a row (word line, see the tenth embodiment) and a column (bit line, see the tenth embodiment) selected by the row decoder 14 and the column decoder 15. As the configuration of the memory cell array 11, for example, the array configuration in the tenth embodiment can be used. The row decoder 14 and the column decoder 15 are realized by applying known circuits.

Data is connected to the inventive device 10 via a bidirectional data bus 20 of eight bits. The number of bits of data is not limited to eight bits, but can be properly changed. The data bus 20 is connected to an input/output buffer 21, and data input to the memory cell array 11 is connected to the memory cell array 11 via a data latch 22 on a bus 23a. On the contrary, data output from the memory cell array 11 to the data bus 20 is connected to the input/output buffer 21 via a sense circuit 28 and a bus 23b and is output to the data bus 20. Incoming data is further connected to a command port control circuit 30 (an example of command control means) on the bus 23a. The command port control circuit 30 receives external signals WE# and CE# and supplies a control signal to the address latch 13, the data latch 22, a negative voltage generation circuit 24, a high voltage generation circuit 25, and a program/erase verifying control circuit 26. External signals CE# and OE# are connected to a chip enable/output enable logic circuit 27. The incoming data, address and control signal are generated by an external microprocessor. The external microprocessor has, usually, the inventive device and other semiconductor memories, thereby configuring a computer system. The sign # used for an external signal indicates that the signal is a signal (negative logic signal) which is active low.

A power source voltage VCC and an exit voltage VSS are connected to the inventive device 10 together with a program voltage VPP. Based on the voltage value of the program voltage VPP, the command port control circuit 30 determines whether reading, programming or erasing operation can be selected or not. The program voltage VPP is connected to the command port control circuit 30, negative voltage generation circuit 24, high voltage generation circuit 25 and program/erase verifying control circuit 26. The location of a generation source of the program voltage VPP is not related to the gist of the present invention. Specifically, the generation source of the program voltage VPP may be on the outside or inside of the inventive device 10.

The chip enable/output enable logic circuit 27 is connected to the input/output buffer 21 and provides a control signal to the input/output buffer 21. The negative voltage generation circuit 24 is connected to the row decoder 14 to provide a negative voltage to be applied to the gate (word line) of a memory cell at the time of erasing data in the memory cell on the memory cell array 11. An output of the high voltage generation circuit 25 is connected to the row decoder 14 and the column decoder 15 in order to provide a high voltage (+5 V or +4 V) to be applied to the gate (word line), a source or a drain (bit line) of a memory cell at the time of programming or erasing data to/from the memory cell on the memory cell array 11. An output of the program/erase verifying control circuit 26 is connected to the row decoder 14 in order to apply a voltage for verification to the gate (word line) of a memory cell on the memory cell array 11 at the time of program/erase verification.

In order to make the automated programming/erasing operations in the circuit for the memory cell array 11 executable, the inventive device 10 is designed so as to receive the command from an external processor on the data bus 20. When the inventive device 10 is selected, the signal CE# shifts to the low level, the inventive device 10 becomes ready to receive a mode command on the data bus 20. The command reaches the command port control circuit 30 via the input/output buffer 21. The command port control circuit 30 receives one of a group of commands of the number which is equal to the number of combinations of the m-th power of 2 (m is the number of bits of data) from the data bus 20. The group of commands includes six commands of program, program-verifying, erase, erase-verifying, array read and signature read commands. The signature read command is a special function and is used to transfer a signal indicative of a hardware product specifying the inventive device 10 and the manufacturer of the product to the outside of the inventive device 10. Depending on the command word received, the command port control circuit 30 generates a control signal for providing a proper operation corresponding to the received command. After the specific command is input to the command port control circuit 30, the write enable signal WE# chip enable signal CE# and output enable signal OE# control generation of various signals from the command port control circuit 30 and the chip enable/output enable logic circuit 27 for proper operations of various units in the inventive device 10.

In this embodiment, the command port control circuit 30 is activated when the program voltage VPP is a proper voltage value, for example, 5 V. However, when inactivation of the command port control circuit 30 is requested, by shifting the program voltage VPP from 5 V to, for example, 0.4 V level or less (such as about 0 V), the command port control circuit 30 can be made inactive. When the program voltage VPP shifts to 0 V, the command port control circuit 30 is made inactive and, as a result, the array command (operation command for the memory cell array 11) targeted for the command port control circuit 30 on the data bus 20 is ignored. When the program voltage VPP is 0 V and the command port control circuit 30 is inactive, the inventive device 10 functions only in the read mode. The mechanism of inactivation of the command port control circuit 30 is used as direct replacement of a conventional EPROM (or an EEPROM used as a read only memory). By the mechanism of inactivation of the command port control circuit 30, when the program voltage VPP is 0 V, the memory cell array 11 is fully protected from being unexpectedly erased or programmed.

Figure 23:
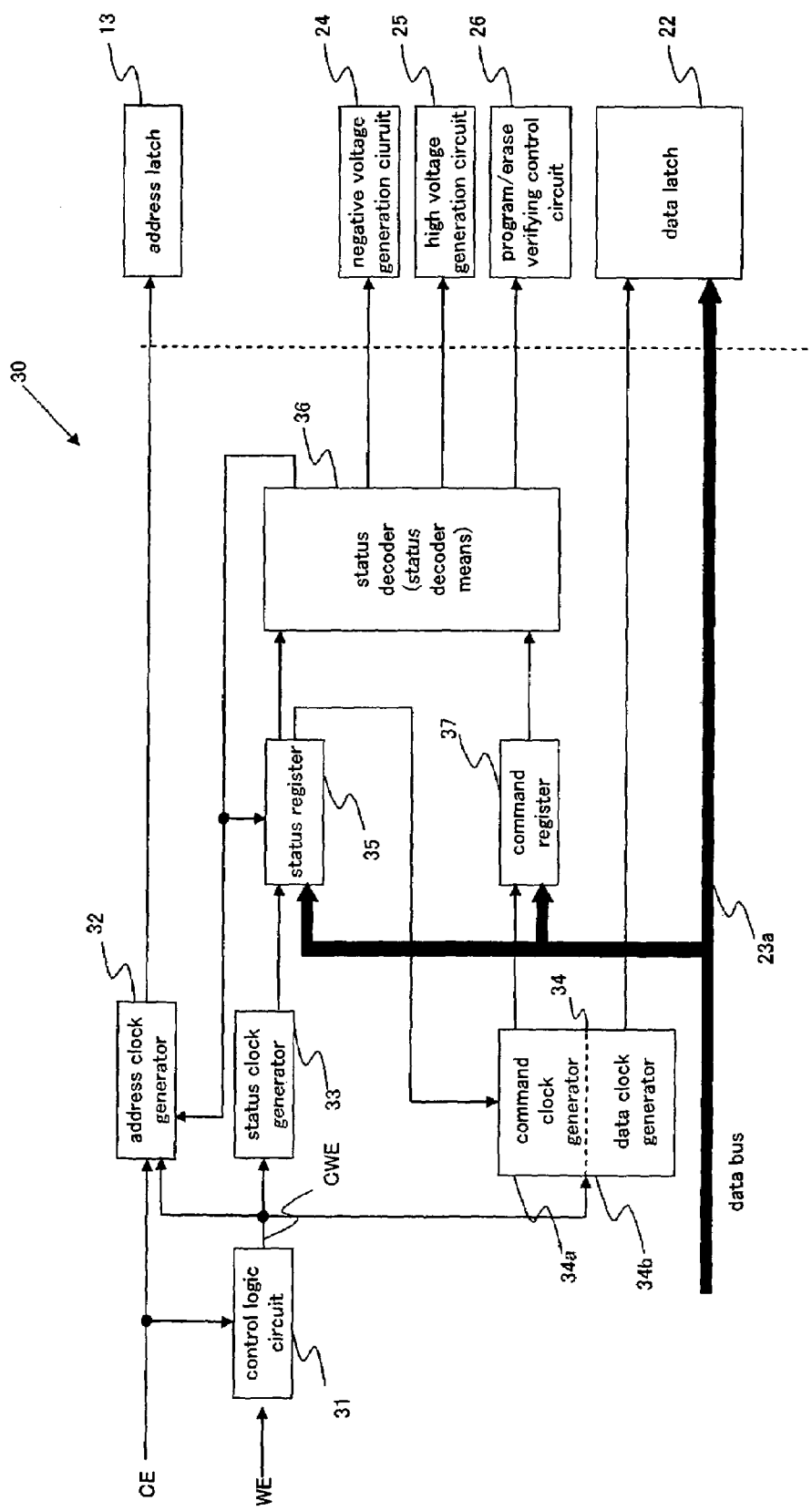
FIG. 23 is a block diagram showing a configuration example of command control means in the semiconductor memory device (eleventh embodiment) of the present invention.

FIG. 23 is a block diagram showing a configuration of the command port control circuit 30 in this embodiment. The chip enable signal CE# is connected to a control logic circuit 31 and an address clock generator 32. The write enable signal WE# is connected as an input to the control logic circuit 31. The control logic circuit 31 allows the write enable signal WE# to be connected to the address clock generator 32, a status clock generator 33 and a command clock generator/data clock generator 34 only when the chip enable signal CE# activates the inventive device 10. An output of the status clock generator 33 is connected to a status register 35 like data of the data bus 23*a*, and an output of the status register 35 is connected to a status decoder 36 (status decoder means) and a command clock generator 34*a*. An output of the command clock generator 34*a* is connected to a command register 37. The command register 37 also receives data from the data bus 23*a* and an output of the command register 37 is connected to the status decoder 36. An output of the address clock generator 32 provides strobe to the address latch 13 (see FIG. 1) and a data clock generator 34*b* provides strobe to the data latch 22 (see FIG. 1). An output of the status decoder 36 is connected to the address clock generator 32 and the status register 35. Other outputs of the status decoder 36 are provided for the negative voltage generation circuit 24, the high voltage generation circuit 25 and the program/erase verifying control circuit 26 (see FIG. 1). The status register 35 supplies a feedback signal to the command clock generator 34*a*, but there is no such feedback to the command register 37.

The memory operation function is selected via the data bus 23*a* during a write cycle controlled by the write enable signal WE# and the chip enable signal CE#. Data in the address latch 13 is updated at the falling edge of the write enable signal WE#. At the rising edge of the write enable signal WE#, a command is loaded to any of the status register 35, command register 37 and data latch 22. The status decoder 36 decodes a new internal mode and provides a corresponding control signal to start a proper operation. By the control signals from the status decoder 36 to the negative voltage generation circuit 24, high voltage generation circuit 25 and program/erase verifying control circuit 26, the circuits 24 to 26 supply the voltage VPP to the row decoder 14, the column decoder 15 and the memory cell array 11. The verify voltage generated from the voltage VPP is applied to a word line via the row decoder 14 in order to guarantee a program/erase margin during program or erase verification.

Figure 24:
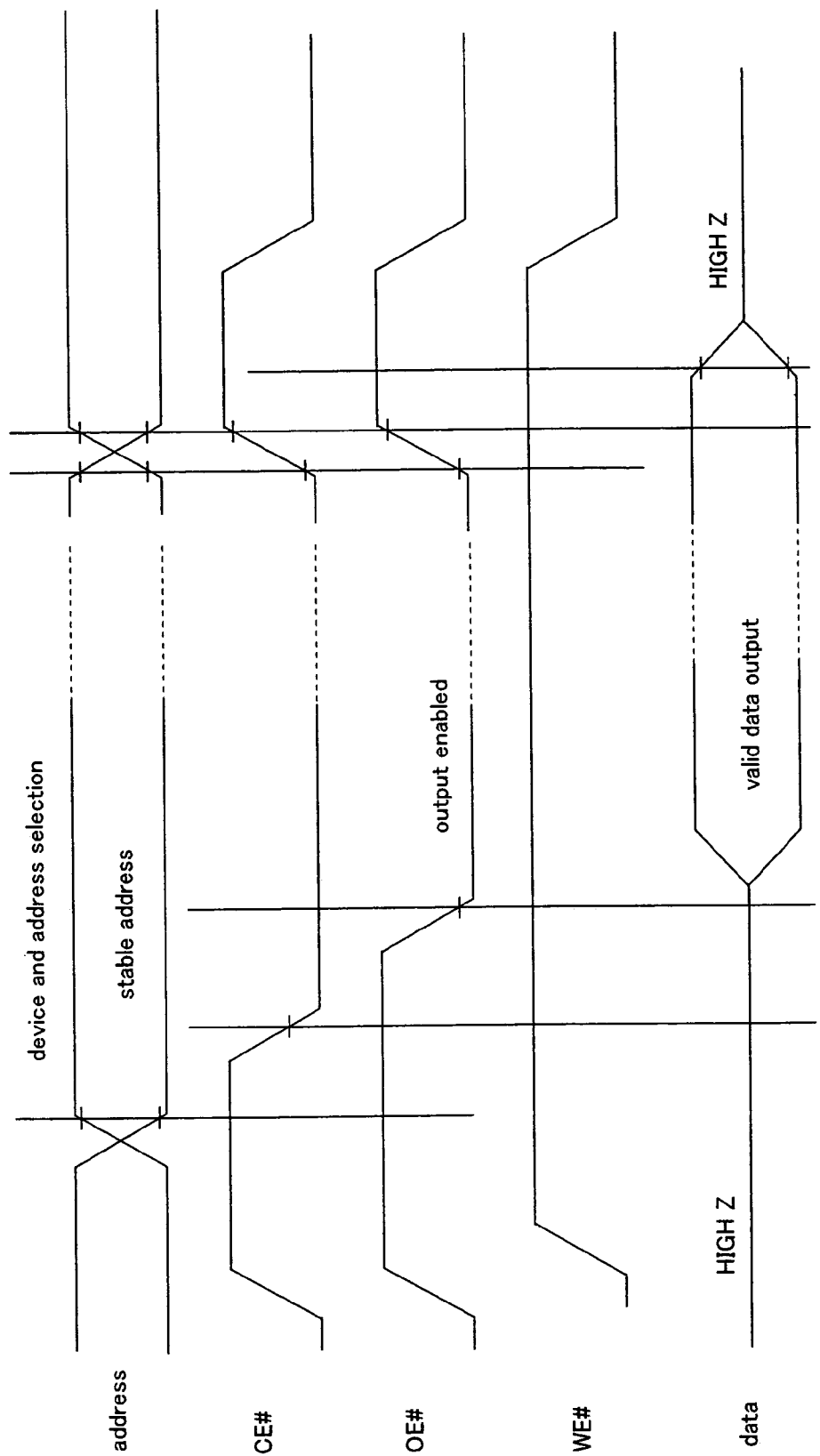
FIG. 24 is a timing waveform chart showing a read cycle in the semiconductor memory device (eleventh embodiment) of the present invention.
Figure 25:
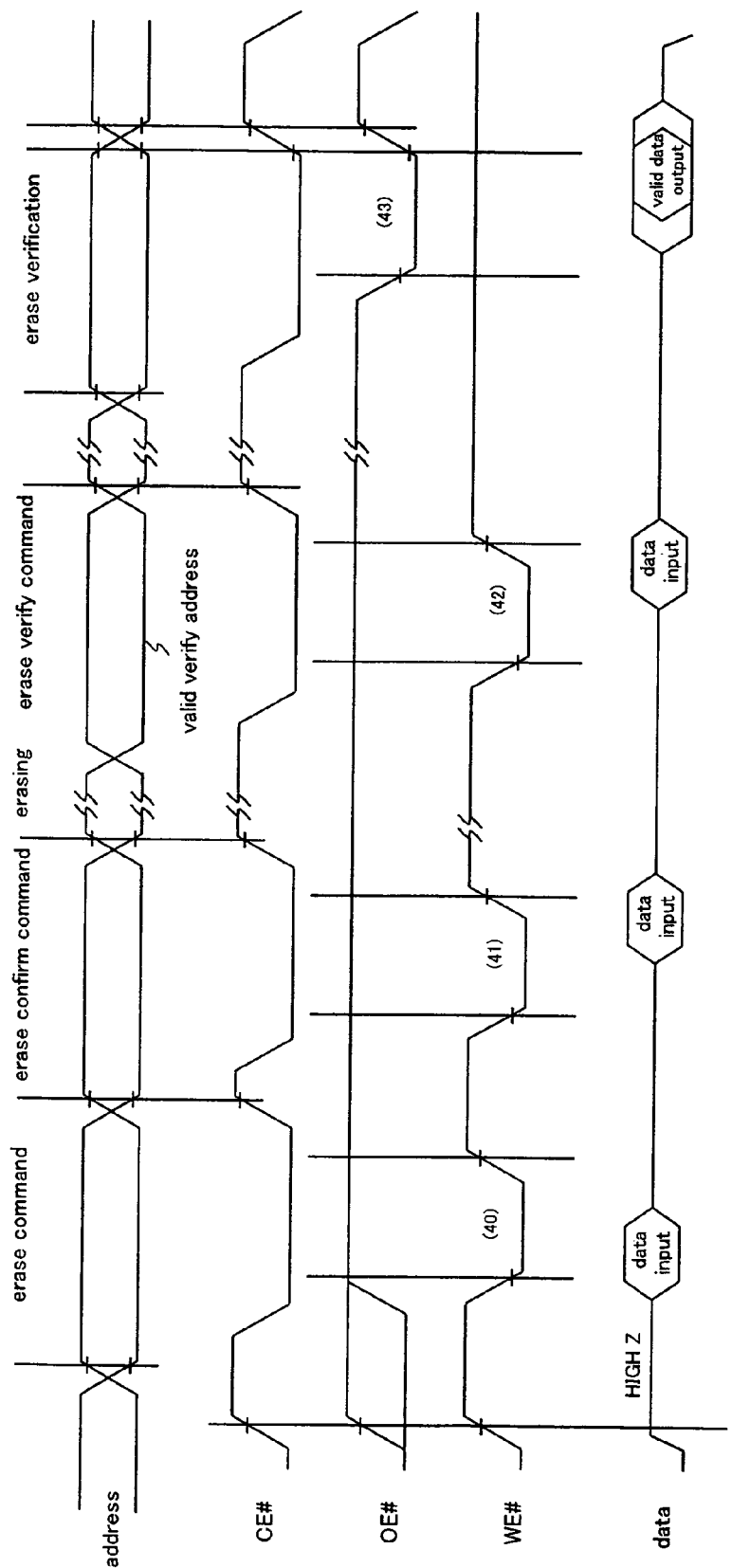
FIG. 25 is a timing waveform chart showing an erase cycle in the semiconductor memory device (eleventh embodiment) of the present invention.
Figure 26:
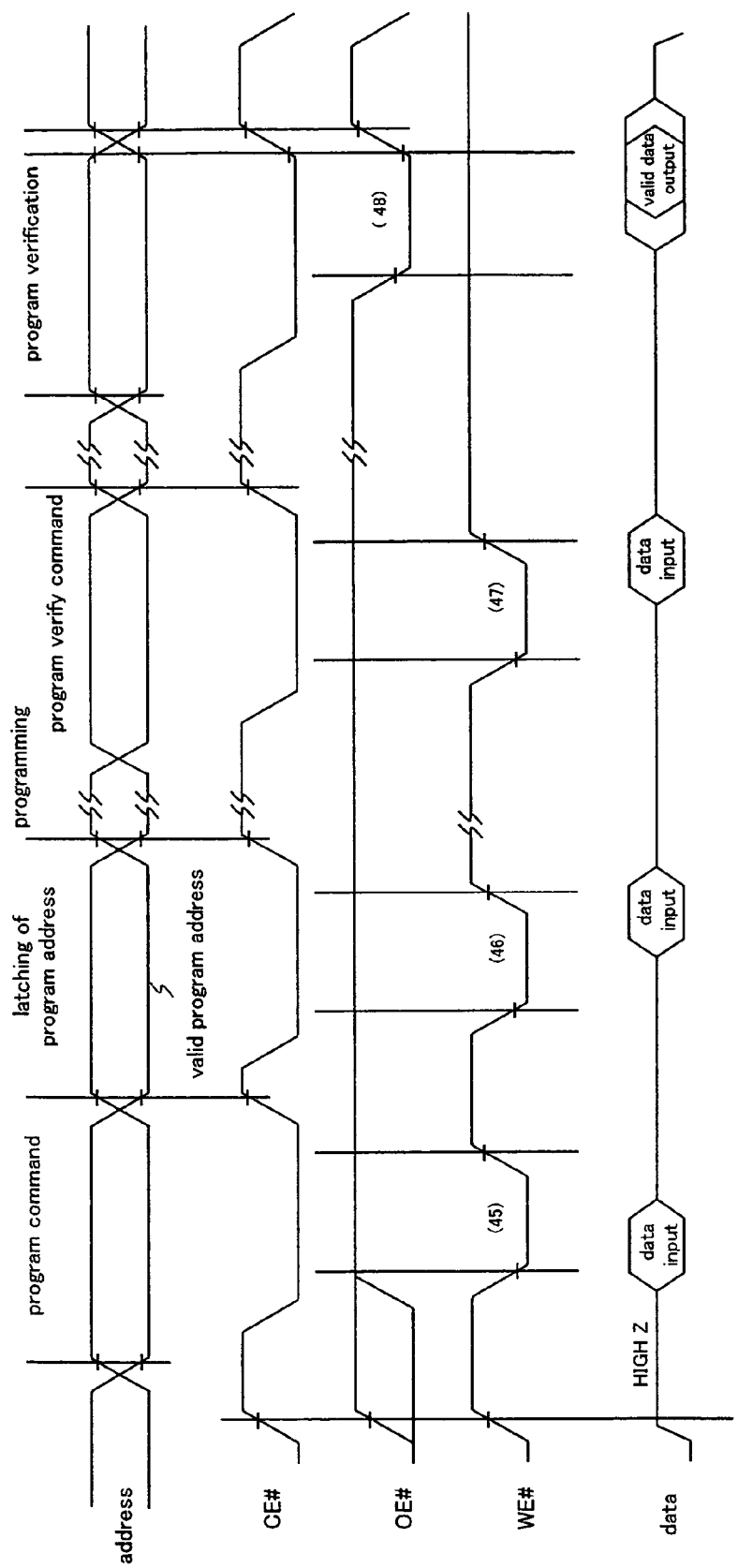
FIG. 26 is a timing waveform chart showing a program cycle in the semiconductor memory device (eleventh embodiment) of the present invention.

FIGS. 24 to 26 show timing waveforms of various signals related to the inventive device 10. FIG. 24 shows the reading operation. When an address in the memory cell array 11 is designated, and the output enable signal OE# activates the chip enable/output enable logic circuit 27 to start the output function of the input/output buffer 21, data is read from the memory cell array 11.

FIG. 25 shows the timing cycles of the erasing operation. In the first write cycle (40), the code of an erase command is written in the command register 37 and the status register 35. In the second write cycle (41), by a second write sequence of writing the code of an erase confirm command into the status register 35, an erasing operation is performed. By the erase confirm code, the erasing operation is started at the rising edge of the second cycle (41) of the signal WE#. The status decoder 36 starts the command for the negative voltage generation circuit 24 and the high voltage generation circuit 25 and necessary erase voltages (negative voltage and high voltage) are supplied to the memory cell array 11. The erasing operation is finished by writing an erase verify command into the status register 35 and the command register 37 in the write cycle (42), the address of a byte to be verified is latched, and an internal erase margin voltage (voltage for verification) is prepared. When the signal OE# is shifted to the low level at time (43), the external microprocessor can access data in the memory cell array 11 on the basis of the accessed address at a standard read timing. The verifying procedure is repeated for all of addresses.

Programming is executed in a manner shown in FIG. 26. A program command is received by the command register 37 and the status register 35 in the first write cycle (45) of the write enable signal WE#. In the second write cycle (46), data in the address latch 13 and the data latch 22 is loaded. The status decoder 36 generates a control signal to the high voltage generation circuit 25 at the rising edge of the second write cycle (46) of the signal WE#, programming is started. The high voltage generation circuit 25 supplies, for example, a program voltage shown in the first embodiment to a predetermined electrode in a selected memory cell in the memory cell array 11. By writing the program verify command into the status register 35 and the command register 37 in the write cycle (47), the programming operation is finished. In order to verify newly programmed data, an internal program margin voltage (voltage for verification) is set. When the signal OE# shifts to the low level at time (48), the external microprocessor can access data in the memory cell array 11 on the basis of the address accessed at a standard read timing.

Figure 27:
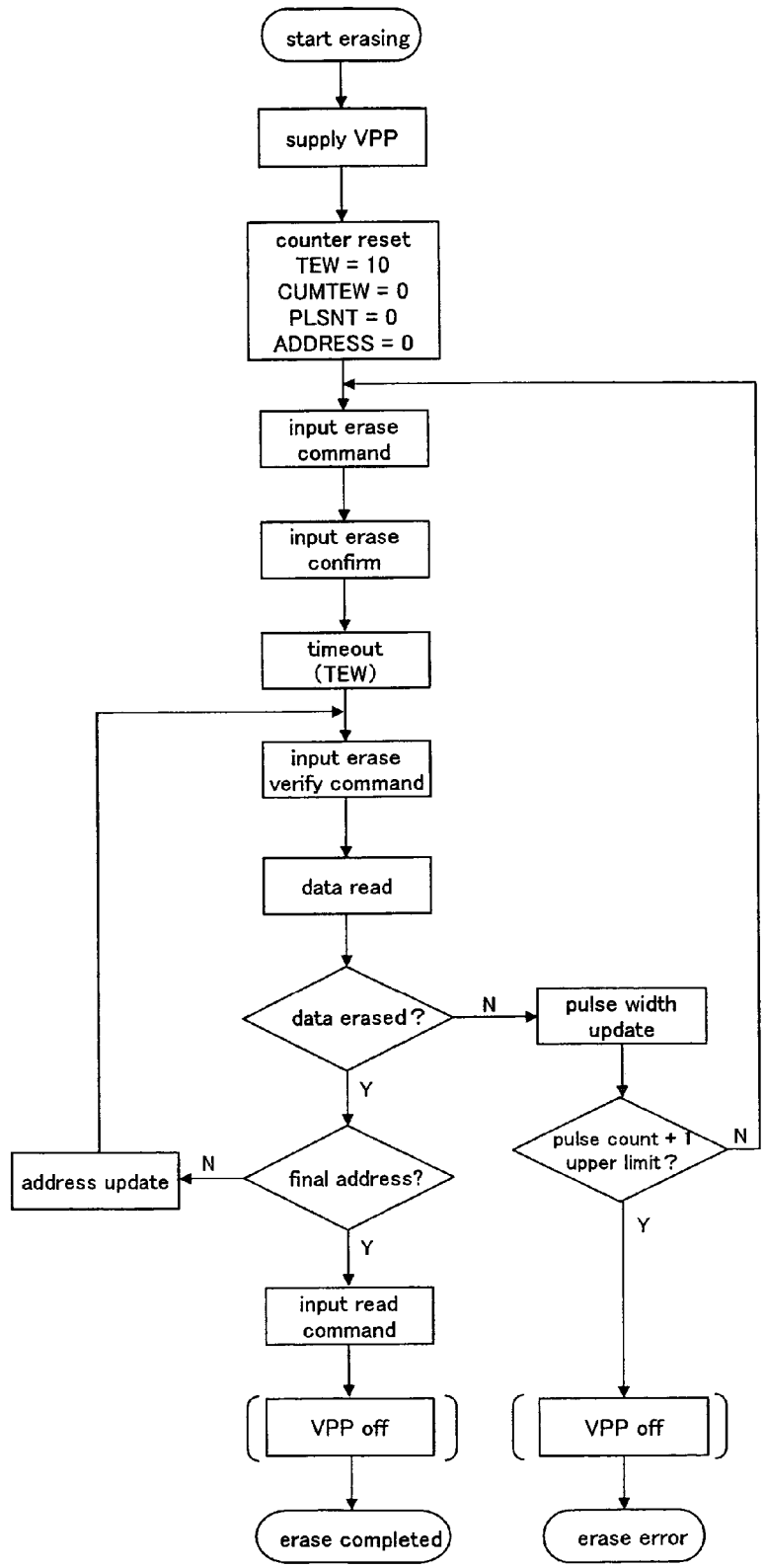
FIG. 27 is a flowchart showing an erase algorithm in the semiconductor memory device (eleventh embodiment) of the present invention.

FIG. 27 shows a flowchart of an erase algorithm used by the command port control circuit 30. The voltage VPP is supplied in an initializing process and the counter is initialized to a predetermined value. An erase command is written and, subsequently, an erase confirm command is written (see FIG. 25 for timings). After lapse of a timeout period in which erasure is accomplished, an erase verify command is written.

If data is not erased, the data erase pulse width is incremented only by a predetermined value (CUMTEW) (an increased amount is added), the resultant is stored in a TEW counter, and a check is made to see whether the resultant erase pulse width is the upper limit value or not. In a preferred embodiment of the present invention, the erase pulse width is incremented to the upper limit value of 10 seconds. After each incrementing process, the erase command and the erase confirm command are written again, and the same sequence is repeated. However, if data is not erased even after the upper limit value of the predetermined number of pulses (for example, 64 times), an erase error that erasing on the memory cell is not completed is recognized. When it is confirmed that data is read and erased, the address is incremented, and the erase verifying sequence is repeated until the final address is verified. When the final address is verified, a read command is rewritten into the command register 37 and the status register 35, the register is reset for the reading operation, and the erase cycle is finished. If data subjected to the erase verification has not been erased, as described above, the erase pulse width is incremented, and the erase sequence is repeated. By restarting the erase verification from data in the final address subjected to the erase and erase verification, improvement in efficiency of the erase sequence is achieved. Although the process of inactivating the voltage VPP is included in the final process in FIG. 27, the voltage VPP supply state may be maintained for the following process.

Figure 28:
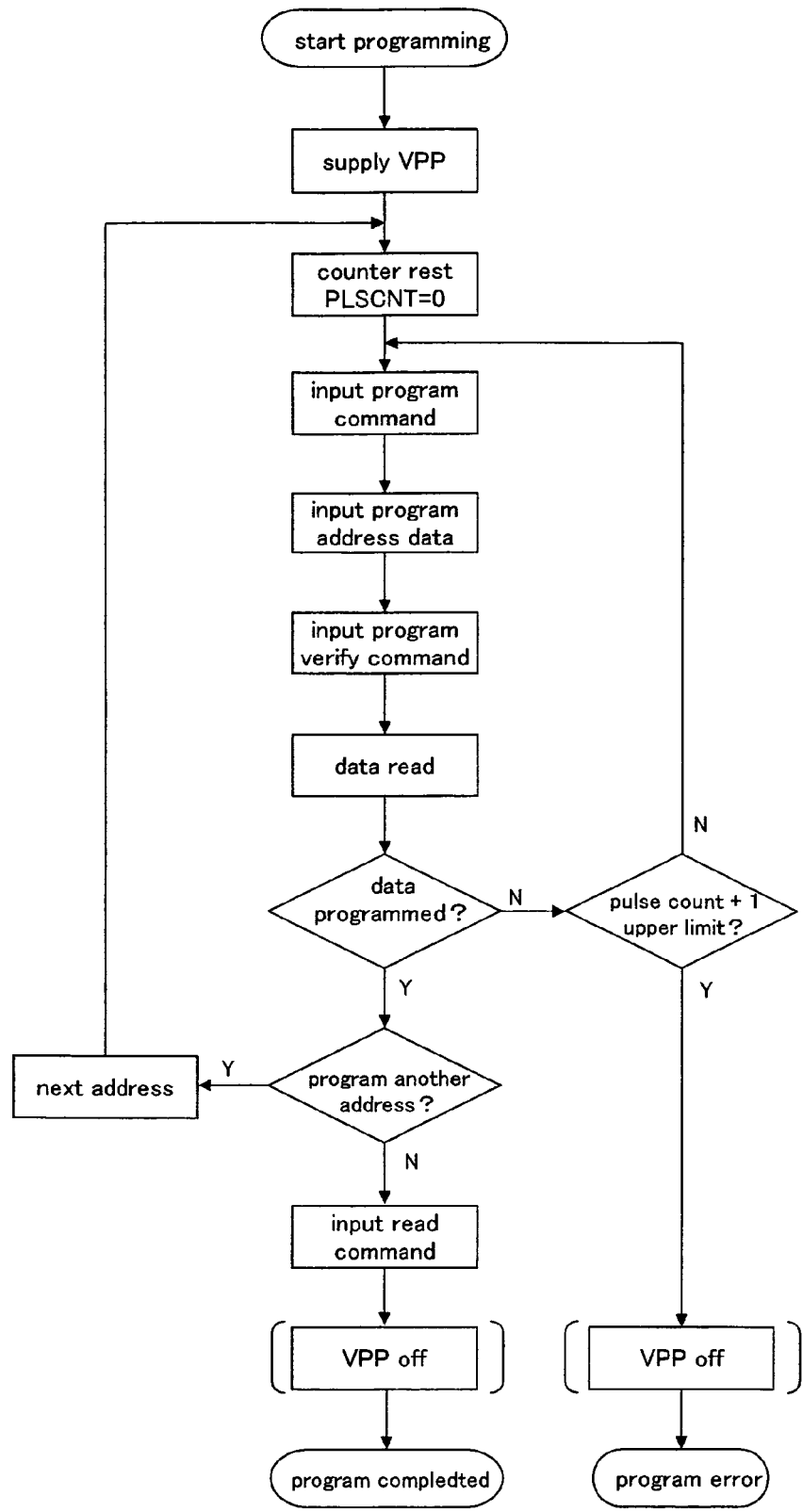
FIG. 28 is a flowchart showing a program algorithm in the semiconductor memory device (eleventh embodiment) of the present invention.

FIG. 28 shows a flowchart of the program algorithm. The program cycle is started when the voltage VPP is supplied in the initializing process and the counter is initialized to a predetermined value. The program command is written into the command register 37 and the status register 35. Subsequently, in the second write cycle, a program address and program data is latched (see FIG. 26 for timings). After that, the program verify command is written, data is read from the memory cell array 11, and a check is made to see whether data is programmed or not. In the case where program data (expectation value) and the data read from the memory cell array 11 do not match, the number of pulses (application) is incremented by one to increase program time, and a program and read (verify) sequence is repeated. By repeating the sequence, the program time can be increased to the upper limit value determined by the product of the program pulse width per time and the maximum number of repetitions. If the program data and the read data do not coincide after the sequence is repeated the maximum number of repetitions, a program error is detected. On the contrary, when it is verified that the read data is correct, if there is programming to another address, the same procedure is repeated for the program address and program data. If there is no address to which programming is performed, the read command is written into the command register 37 and the status register 35, the registers are reset for the reading operation, and the program cycle is finished. Although the process of inactivating the voltage VPP is included in the final process in FIG. 28, the voltage VPP supply state may be maintained for the following process like in the erase cycle.

The clock generators 32 to 34, the command register 37 and the status register 35 in the command port control circuit 30 will now be briefly described.

In a preferred embodiment, inverters connected in tandem are used to provide time delay for generating a strobe from the address clock generator 32 to the address latch 13. The command register 37 is configured by four separate registers. Three of the four registers are used for selecting a mode, and the remaining one register is used for decoding and latching an invalid input. The status register 35 has two separate registers. One of the registers is used for feedback control for activating programming and erasing, and the other register is used to control a data input flow to the data latch 22 or the command register 37. The command clock generator 34a and the data clock generator 34b have the function of generating non-overlap clock phases needed by the registers and the data latch 22. By the command and the data clock, latching of input data in the write cycle period to the data latch 22, command register 37 and status register 35 is controlled.

The address clock generator 32 takes the load of controlling the flow of address information to the address latch 13. The command register 37 and the status register 35 are the heart of the command port structure, receive input data from the input/output buffer 21 and store the data in order to decode an operation mode of the inventive device 10. A command is interrupted on the basis of data bits of the three registers in the command register 37 and a predetermined truth table. To the command register 37, its output is not fed back. The command register 37 traces a single operation mode and selects an entry to plural operation modes. The status register 35 has a feedback path from its output to an input and traces continuous operations performed when the inventive device 10 shifts to various states of the plural operation modes.

The inventive device 10 according to the eleventh embodiment has been described above in detail. The embodiment has been described above in which, in the program and erase cycle, the external processor inputs the program and erase verify command to the inventive device 10 as described above, reads data output from a data terminal, and determines whether programming or erasing has been normally completed or not. Related to the preferred embodiment, as a method of further lessening the load of the external processor, an input of the program and erase verify command is omitted, and the erase and program sequence shown in FIGS. 27 and 28 is automatically processed in the program/erase control logic provided in the inventive device 10. With the configuration, the external processor becomes free from the process required for the program and erase verification.

Therefore, in the case of taking the program sequence shown in FIGS. 26 and 28 as an example, when a program address and program data is latched in the second write cycle, the status decoder 36 generates a control signal to the high voltage generation circuit 25 at the rising edge of the second cycle (46) of the signal WE#, thereby starting programming. Consequently, it is sufficient to automatically verify program data at a predetermined timing after that, determine whether data programming shown in FIG. 28 is normal or not, and automatically process branching and repetition illustrated. It is sufficient to realize the program/erase control logic by using a state machine or a built-in dedicated microcontroller which operates by a micro-program for controlling the process, and execute the control.

Twelfth Embodiment

Figure 29:
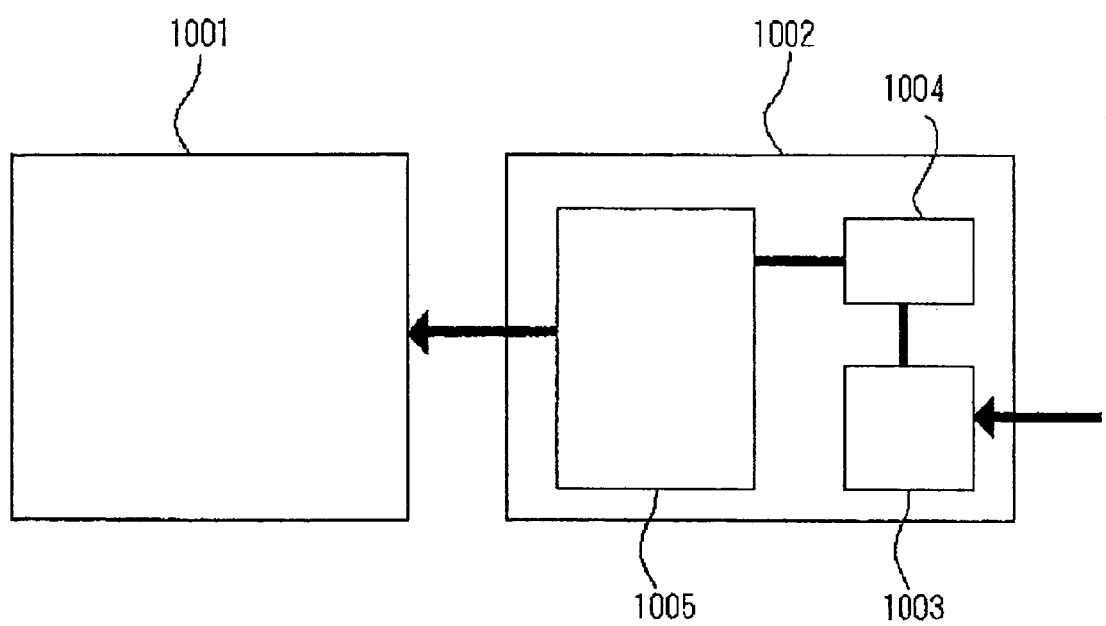
FIG. 29 is a schematic configuration diagram of a liquid crystal display (twelfth embodiment) in which the semiconductor memory device of the present invention is assembled.

As an application example of the semiconductor memory device, for example, as shown in FIG. 29, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004, and a liquid crystal driver circuit 1005 are provided. The nonvolatile memory 1003 is configured by the memory cell of the present invention, more preferably, the semiconductor memory device of any of the tenth to thirteenth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 29 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mount a rewritable nonvolatile memory for storing correction information. As the nonvolatile memory, it is preferable to use the memory cell of the present invention. Particularly, it is preferable to use the semiconductor memory device of the eleventh embodiment in which memory cells of the present invention are integrated.

By using the memory cell of the present invention as a nonvolatile memory for image adjustment of the liquid crystal panel, a process of simultaneously forming the memory cell and a circuit such as the liquid crystal driver is facilitated. Thus, the manufacturing cost can be reduced.

Thirteenth Embodiment

Figure 30:
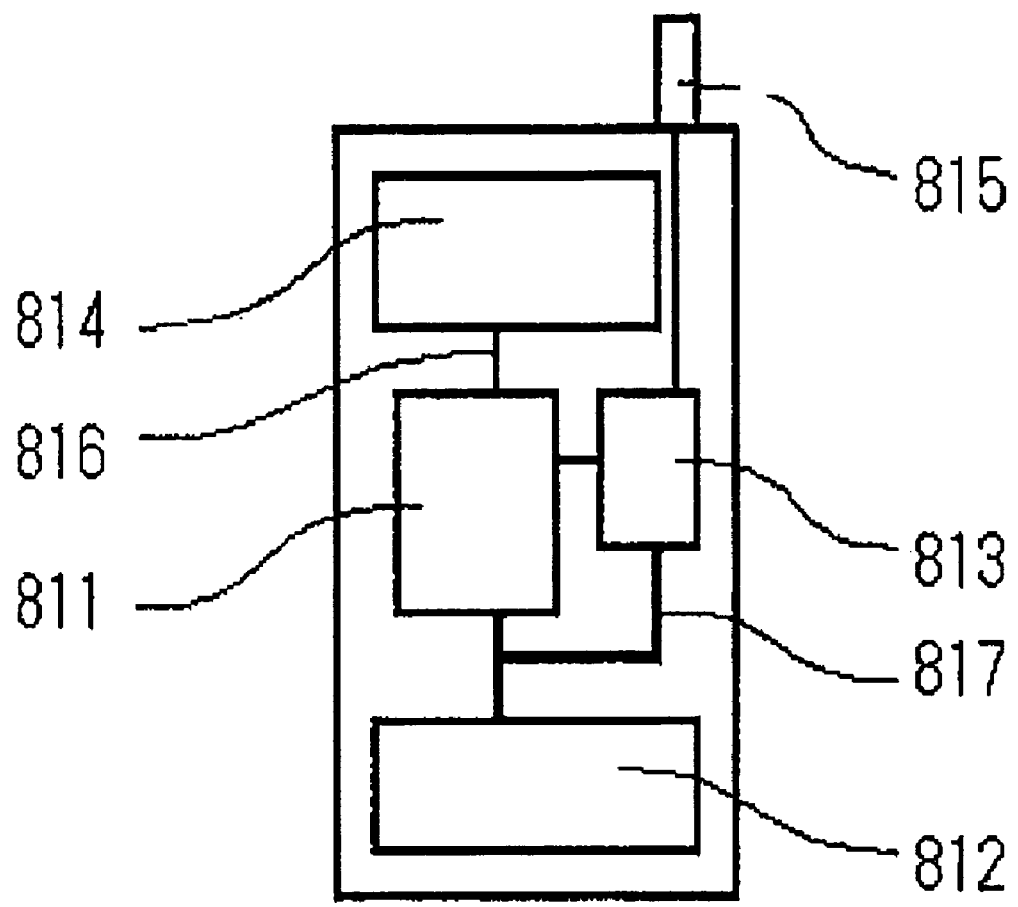
FIG. 30 is a schematic configuration diagram of a portable electronic apparatus (thirteenth embodiment) in which the semiconductor memory device of the present invention is assembled.
Figure 31:
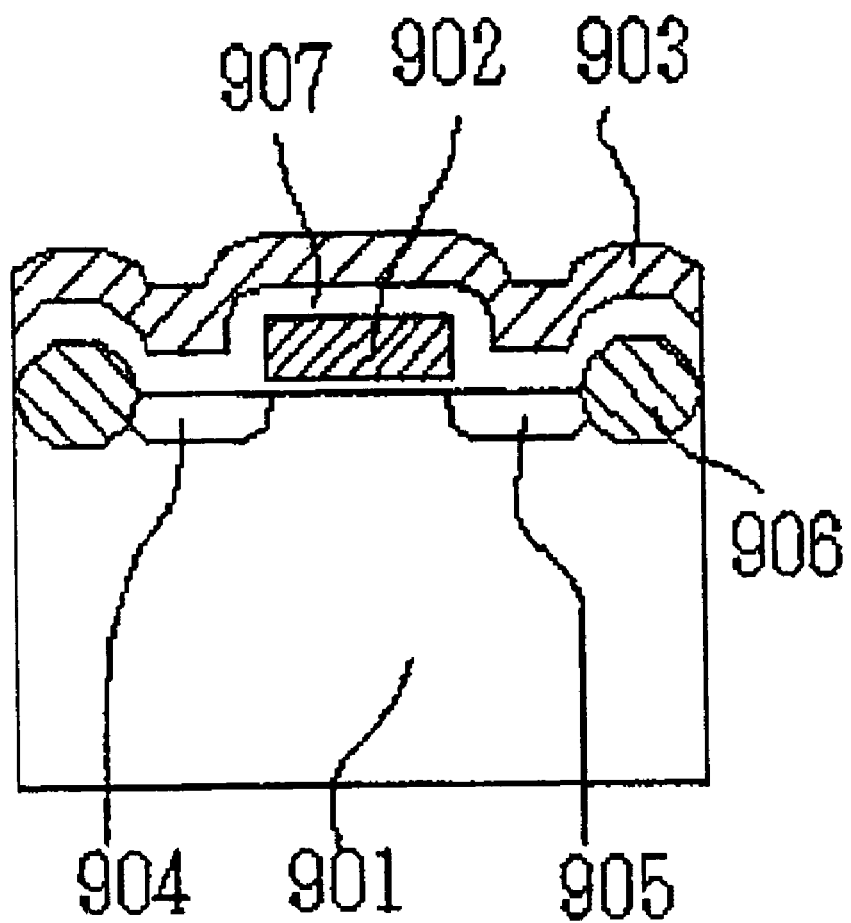
FIG. 31 is a schematic sectional view showing a main part of a conventional flash memory.

FIG. 30 shows a portable telephone as a portable electronic apparatus in which the semiconductor memory device is assembled.

The portable telephone is mainly configured by a control circuit 811, a battery 812, an RF (Radio Frequency) circuit 813, a display part 814, an antenna 815, a signal line 816, a power source line 817 and the like. In the control circuit 811, the semiconductor memory device of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

By using the semiconductor memory device capable of performing high-speed reading operation and whose process of simultaneously mounting a memory part and a logic circuit part is easy for a portable electronic apparatus, the operation speed of the portable electronic apparatus is increased, and the manufacturing cost can be reduced. Thus, a cheap, high-reliability and high-performance portable electronic apparatus can be obtained.

The semiconductor memory device according to the present invention provides a command port structure of executing memory operations such as programming and erasing of data to/from the memory cell array via a data terminal. Since the memory operation circuit means for performing a memory operation onto the memory cell array is provided, circuit means for performing an operation of programming/erasing data to/from the memory cell array and an operation of verifying the programming/erasing (verifying completion of the operation) is provided. Since the command control means is provided, a command related to the memory operation can be received from a data bus connected to an external user such as an external processor. A command written in the command control means can provide a command for generating a control signal for programming/erasing data to/from a memory cell array and recognizing the data in the memory cell array after the programming/erasing operation.

In the memory cell, a memory function of the memory functional element and a transistor operation function of the gate insulating film are separated from each other. Consequently, it is possible to suppress the short channel effect by thinning the gate insulating film without deteriorating the memory function.

Further, a value of current flowing between the diffusion regions changes by rewriting more largely than that in the case of an EEPROM. Therefore, it facilitates discrimination between the programming state and the erasing state of the semiconductor memory device, and the reliability can be improved.

Further, the memory cell can be formed by a process which is very compatible with a normal transistor forming process. Therefore, as compared with the case of using a conventional flash memory as a nonvolatile memory cell and configuring the semiconductor memory device by the nonvolatile memory cell and an amplifier which is usually made by a transistor, the number of masks and the number of processes can be dramatically reduced. Consequently, the yield in manufacturing of a chip on which both of the amplifier and the nonvolatile memory cell are formed can be improved, the manufacturing cost is reduced and, accordingly, a very-reliable, cheap semiconductor memory device can be obtained.

In the case where the gate electrodes in a pair of memory cells integrally function as a word line and the memory functional elements in the pair of memory cells are integrally shared on both sides of the gate electrode, wiring for connecting the gate electrodes can be omitted and the packing density of the semiconductor memory device can be improved. It is unnecessary to separate the memory functional elements for each memory cell, so that the manufacturing process can be simplified.

In the case where the memory functional element is formed so that at least a part thereof overlaps with a part of the diffusion region, reading speed of the semiconductor memory device can be increased sufficiently high.

When the memory functional element includes a film having the function of retaining charges and having a surface almost parallel with a surface of the gate insulating film, variations in the memory effect of the memory cell can be reduced and variations in the read current of the semiconductor memory device can be suppressed. Since a characteristic change in the memory cell which is storing information can be reduced, the information retaining characteristic of the semiconductor memory device can be improved.

When the film having the function of retaining charges is disposed almost parallel with a side face of the gate electrode, rewriting speed of the memory cell increases, so that the rewriting operation of the semiconductor memory device can be performed at high speed.

In the case where the memory functional element includes an insulating film for separating between the film having the function of retaining charges and the channel region or the semiconductor layer, and the insulating film is thinner than the gate insulating film and has a thickness of 0.8 nm or more, the voltage in the programming and erasing operations of the semiconductor memory device can be lowered or the programming and erasing operations can be performed at higher speed. Since the memory effect of the memory cell increases, the reading speed of the semiconductor memory device can be increased.

In the case where the memory functional element includes an insulating film for separating between the film having the function of retaining charges and the channel region or the semiconductor layer, and the insulating film is thicker than the gate insulating film and has a thickness of 20 nm or less, the retaining characteristic can be improved without deteriorating the short channel effect of the memory cell. Consequently, even when the packing density of the semiconductor memory device is increased, sufficient retaining characteristic performance can be obtained.

The display of the present invention has the semiconductor memory device. Consequently, the nonvolatile memory cell can be used for storing information for correcting display variations after a display panel is manufactured, and the picture qualities of products of the displays can be made uniform. Moreover, a process of simultaneously forming the memory cell and the logic circuit part is simple, so that the manufacturing cost can be suppressed and a cheap and very-reliable display can be obtained.

Since the electronic apparatus, particularly, the portable electronic apparatus of the present invention has the semiconductor memory device, the process of simultaneously forming the memory part and the logic circuit part becomes easy. The operating speed of the electronic apparatus can be improved, and the manufacturing cost can be reduced. Moreover, the cheap and reliable display can be obtained.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
   a memory cell array in which memory cells are arranged in a matrix;
   memory operation circuit means, connected to the memory cell array, for executing a memory operation on the memory cell array; and
   command control means, connected to the memory operation circuit means, for receiving a command from an external user via a plurality of data terminals, and generating a predetermined control signal to the memory operation circuit means on the basis of the received command to control execution of the memory operation by the memory operation circuit means, wherein
   the memory operation circuit means is configured so as to be able to receive an address from the external user via a plurality of address input terminals and data to be stored into the memory cell array via the data terminals, and provide the data stored in the memory cell array to the external user via the data terminals,
   the command control means includes command/status register means, clock generation means and status decoder means,
   the command/status register means stores the command and traces a procedure of the memory operation,
   the clock generation means generates a timing signal to the memory operation circuit means and the command/status register means to latch the address and the data to the memory operation circuit means and to control latching of the command to the command/status register means,
   the status decoder means is connected to the command/status register means and decodes a command received by the command/status register means in order to generate a predetermined control signal for the memory operation circuit means, and
   the memory cell includes a gate electrode formed over a semiconductor layer via a gate insulating film, a channel region disposed below the gate electrode, diffusion regions disposed on both sides of the channel region and having a conductive type opposite to that of the channel region, and memory functional units formed on both sides of the gate electrode and having the function of retaining charges.

2. The semiconductor memory device according to claim 1, wherein
   the memory operation includes a reading operation, a programming operation, an erasing operation, a program-verifying operation and an erase-verifying operation, and
   the command includes at least a program command and an erase command.

3. The semiconductor memory device according to claim 1, wherein
   the command/status register means includes a command register and a status register,
   the command register stores a received command therein, and
   the status register stores the command therein and traces a procedure of the memory operation.

4. The semiconductor memory device according to claim 3, wherein
   the memory operation circuit means includes an address register for decoding an address in the memory cell array, and a data register for latching the data.

5. The semiconductor memory device according to claim 4, wherein
   the clock generation means includes:
   an address clock generator, connected to the address register, for generating an address timing signal to control latching of the address to the address register;
   a data clock generator, connected to the data register, for generating a data timing signal to control latching of the data to the data register;
   a command clock generator, connected to the command register, for generating a command timing signal to control latching of the command to the command register; and
   a status clock generator, connected to the status register, for generating a status timing signal to control latching of the command to the status register, and
   the data timing signal does not overlap with the command timing signal and the status timing signal.

6. The semiconductor memory device according to claim 1, wherein
   when the command control means is activated, the command control means receives a write enable signal which enables the command to be written into the command control means.

7. The semiconductor memory device according to claim 1, wherein
   the memory functional element is formed so that at least a part thereof overlaps with a part of the diffusion region.

8. The semiconductor memory device according to claim 1, wherein
   the memory functional element includes a film having the function of retaining charges, and
   a surface of the film having the function of retaining charges is disposed almost parallel with a surface of the gate insulating film.

9. The semiconductor memory device according to claim 8, wherein
   the film having the function of retaining charges is disposed almost parallel with a side face of the gate electrode.

10. The semiconductor memory device according to claim 8, wherein
    the memory functional element includes an insulating film for separating between the film having the function of retaining charges and the channel region or the semiconductor layer, and the insulating film is thinner than the gate insulating film and has a thickness of 0.8 nm or more.

11. The semiconductor memory device according to claim 8, wherein
the memory functional element includes an insulating film for separating between the film having the function of retaining charges and the channel region or the semiconductor layer, and
the insulating film is thicker than the gate insulating film and has a thickness of 20 nm or less.

12. A display comprising the semiconductor memory device according to claim 1.

13. A portable electronic apparatus comprising the semiconductor memory device according to claim 1.

* * * * *